(12) United States Patent
Lenz et al.

(10) Patent No.: US 11,614,507 B2
(45) Date of Patent: Mar. 28, 2023

(54) MR SYSTEM WITH IMPROVED PROTECTION AGAINST CARDIOSTIMULATION

(71) Applicant: Siemens Healthcare GmbH, Erlangen (DE)

(72) Inventors: Helmut Lenz, Oberasbach (DE); Lennart Kilian, Gauting (DE); Daniel Niederlöhner, Erlangen (DE); Dirk Schneiderbanger, Langensendelbach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/554,325

(22) Filed: Dec. 17, 2021

(65) Prior Publication Data

US 2022/0196767 A1  Jun. 23, 2022

(30) Foreign Application Priority Data

Dec. 17, 2020  (DE) .......................... 10 2020 216 173

(51) Int. Cl.
*G01R 33/38* (2006.01)
*G01R 33/385* (2006.01)
*G01R 33/36* (2006.01)

(52) U.S. Cl.
CPC ..... *G01R 33/3852* (2013.01); *G01R 33/3607* (2013.01)

(58) Field of Classification Search
CPC ............ G01R 33/3852; G01R 33/3607; G01R 33/288
See application file for complete search history.

(56) References Cited

U.S. PATENT DOCUMENTS 6,169,403 B1  1/2001  Hebrank
6,671,330 B1  12/2003  Lenz et al.
(Continued)

FOREIGN PATENT DOCUMENTS

DE  19857525 A1  6/2000
DE  19913547 C2  7/2003
DE  102017219907 B3  10/2018

OTHER PUBLICATIONS

International Standard, Edition 3.0; Mar. 2010; "Medical electrical equipment" IEC 60601-2-33. ISBN 978-2-88910-221-1. (2010). pp. 1-224.

*Primary Examiner* — G. M. A Hyder
(74) *Attorney, Agent, or Firm* — Lempia Summerfield Katz LLC

(57) ABSTRACT

A method for operating an MR system with a gradient pulse amplifier unit that has an end stage connected to a gradient coil with switching elements is provided. The gradient pulse amplifier unit includes a modulator for actuating the switching elements, and lockout switches interconnected in signal paths from the modulator to the switching elements. The gradient pulse amplifier unit includes feeder circuit breakers interconnected in at least some signal paths from the modulator to the switching elements. The circuit breakers are connected in the associated signal paths downstream of the lockout switches. A gradstop unit configured to receive at least one shut-off signal and actuate the lockout switches and the feeder circuit breakers. When the gradstop unit receives a shut-off signal, the gradstop unit actuates the lockout switches to lock out and the feeder circuit breakers to output an actuation signal to the switching elements.

14 Claims, 8 Drawing Sheets

(56) References Cited

U.S. PATENT DOCUMENTS

| 10,024,935 B2* | 7/2018 | Ham | G01R 33/3852 |
| 2019/0137580 A1* | 5/2019 | Lenz | G01R 33/3852 |
| 2022/0179020 A1* | 6/2022 | Lenz | G01R 33/3664 |

* cited by examiner

MR SYSTEM WITH IMPROVED PROTECTION AGAINST CARDIOSTIMULATION

This application claims the benefit of German Patent Application No. DE 10 2020 216 173.9, filed Dec. 17, 2020, which is hereby incorporated by reference in its entirety.

BACKGROUND

The present embodiments relates to operating a magnetic resonance (MR) system with a gradient pulse amplifier unit. The present embodiments are applicable, for example, to magnetic resonance tomography systems with a high gradient current.

Humans are sensitive to rapid changes in a magnetic flux dB/dt that acts on them. A major change in the magnetic flux that persists for "a sufficiently long time" may trigger a nerve stimulation and/or a stimulation of the heart muscle tissue, where, according to standard IEC 60601-2-33, the time-related evaluation (e.g., "a sufficiently long time") of the rapid change in the magnetic field with respect to nerve stimulation lies in the range of 0.12 ms to 0.8 ms, and with respect to cardiostimulation, in the range of 1 ms to 8 ms (usually approximately 3 ms is assumed).

Previous gradient systems of magnetic resonance (MR) tomography systems were capable of triggering a nerve stimulation. Newer MR systems with a stronger gradient system may also trigger a cardiostimulation. A nerve stimulation primarily causes a sensation of pain; a cardiostimulation, by contrast, signifies the influencing of the heartbeat and therefore is to be regarded as life-threatening.

A method for calculation of the stimulation is known from DE 199 13 547 C2. This may be carried out by a program and a computer, by an appropriately programmed processor or digital signal processor (DSP), or by an analog or digital hardware circuit. If the result of the calculation is an overshooting of a specified limit value, a signal is triggered so the gradient current flowing through a gradient coil is reduced sufficiently slowly and thus in a non-stimulating manner. It is, however, precisely this non-stimulating reduction of the gradient current that assumes that particular switching elements in an end stage of a gradient pulse amplifier unit (GPA) of the gradient system are to be switched on and others, by contrast, are to be switched off. This procedure is referred to as a "softstop" and is disclosed, for example, in DE 198 57 525 A1. A simple switching off of all end stage switching elements (what is known as a "hardstop") results, by contrast, in a current reduction with maximum edge steepness, but this represents the case that should be avoided in order to avoid a cardiostimulation.

With MR systems having a gradient strength that may trigger only a stimulation of the nerves, a stimulation monitoring in accordance with DE 199 13 547 C2 may exist, which causes the slow reduction of the gradient current via the gradient pulse amplifier unit. Particular additional protective measures are omitted, however, since such MR systems work very reliably and an individual nerve stimulation in the case of a one-time hardstop is experienced only as a brief pinprick. A plurality of overshoots of the nerve stimulation threshold in the brief progression of an MR sequence may be reliably prevented by existing stimulation monitoring.

Some MR systems, which reach the cardio threshold, also have monitoring against overshooting of the cardio threshold in corresponding gradient pulse amplifier units. This monitoring has multiple redundancy since a plurality of gradient pulse amplifier units are operated jointly and, by way of an additional measure, when one gradient pulse amplifier unit is shut off, the other gradient pulse amplifier units are shut off by "softstop".

The most common cause of a hardstop is a power failure. Monitoring of the line voltage may also be available in each gradient pulse amplifier unit therefore, and this is to react so quickly that the power supply voltages for the driving circuits are still available for a sufficiently long time in the event of power failure for a slow current reduction initiated by this monitoring (e.g., softstop) to be concluded. There are no safeguards against further causes of a hardstop (e.g., failure of the power supply, failure of the clock-pulse supply of modulator FPGAs, malfunctioning of the modulator, etc.). A defibrillator and a doctor should be rapidly accessible at these research facilities, therefore.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a hardstop and/or damage to an end stage of a gradient pulse amplifier unit of a magnetic resonance (MR) system is prevented.

A method for operating an MR system with a gradient pulse amplifier unit is provided. The gradient pulse amplifier includes at least one end stage connected to a gradient coil with in each case a plurality of switching elements, a modulator for actuating the switching elements of the end stage, and switches (hereinafter referred to without limiting the generality as "lockout switches") interconnected in the signal paths from the modulator to the switching elements. The lockout switches, when operated, lock out the associated signal paths for actuation signals output by the modulator. The gradient pulse amplifier also includes switches (hereinafter referred to without limiting the generality as "feeder circuit breakers") interconnected in at least some signal paths from the modulator to the switching elements. The circuit breakers are connected in the associated signal paths downstream of the lockout switches and, when operated on the associated signal paths, apply an actuation signal to the switching elements of the end stage connected to these signal paths. The gradient pulse amplifier includes a gradstop unit configured to receive at least one shut-off signal and to then actuate the lockout switches and the feeder circuit breakers. Within the framework of the method, when the gradstop unit receives a shut-off signal, the gradstop unit actuates the lockout switches to lock out and the feeder circuit breakers to output an actuation signal to the switching elements.

This method results in the advantage that the actuation signals (e.g., switching element "on" or switching element "off") normally output by the modulator to the switching elements are blocked by the gradstop unit, and instead, new actuation signals are output via the line elements to the switching elements connected to these line elements. The actuation patterns generated by the new actuation signals may be used, for example, to actuate the switching elements such that instead of an otherwise generated "hardstop", a "softstop" is generated.

The method therefore includes, for example, the functional sequence that (1) the gradstop unit receives a shut-off signal;
(2) the gradstop unit then locks out the signal paths from the modulator to the switching elements of the end stage by actuation of the lockout switches; and
(3) by actuation of the feeder circuit breakers, the gradstop unit generates an actuation pattern (e.g., a new actuation pattern) that switches the switching elements of the end stage connected to the feeder circuit breakers (e.g., with an actuation pattern that corresponds to a "softstop").

The lockout switches are configured and wired such that the lockout switches let the actuation signals, output at modulator outputs of the modulator, for the switching elements of the end stage pass without actuation by the gradstop unit; with actuation by the gradstop unit, the lockout switches act in the sense of locking out, however, such that the lockout switches neutralize the actuation signals of the modulator, so the lockout switches have no further effect on the circuit of the switching elements of the end stage. For example, the lockout switches may cause output signals, generated by the lockout switches, to be generated on the signal paths instead of the actuation signals of the modulator. The output signals, if not modified by actuated feeder circuit breakers, cause the switching elements of the end stage to shut off. This may be implemented, for example, such that modulator outputs of the modulator are connected to inputs of the lockout switches. When the lockout switches are not actuated by the gradstop unit, the lockout switches conduct actuation signals (e.g., possibly amplified) output to the modulator outputs and, with actuation by the gradstop unit, output signals that are independent of the actuation signals of the modulator outputs (e.g., signals with a "low" or "high" level). For example, the same signal is output to all lockout switches actuated by the gradstop unit. That the gradstop unit actuates the lockout switches may also be expressed such that the gradstop unit operates or activates the lockout switches.

The feeder circuit breakers are configured, for example, such that without actuation via the gradstop unit, the feeder circuit breakers have no effect on the associated signal path, but with actuation by the gradstop unit, apply or impress an actuation signal to/on the signal path at the end stage. For example, the feeder circuit breakers may cause actuation signals to be impressed on the associated signal paths, which cause the associated switching elements of the end stage to switch on.

For example, an actuation pattern for the switching elements of the end stage may in this way be impressed onto the signal paths by the gradstop unit. Switching elements with signal paths in which no feeder circuit breaker is interconnected are switched off, and switching elements with signal paths in which a feeder circuit breaker is interconnected are switched on. This may be implemented particularly easily in terms of circuitry and in the case of a disturbance results in a particularly reliable possibility for generating a "softstop".

A signal path corresponds, for example, to a path or a signal link between a modulator output of the modulator and of the end stage (e.g., a particular switching element of the end stage). The signal path may be, for example, continuously electric or additionally include a galvanically isolating signal link section (e.g., a branch circuit (such as with optocouplers)).

The gradstop unit includes, for example, two outputs, of which the first output leads to the lockout switches and at the second output a signal for actuation of the feeder circuit breakers is generated. In one embodiment, the shut-off signal is output at the first output. For this purpose, the gradstop unit may have, for example, a simple branch between an input and the first output. For example, the shut-off signal or a signal inverted thereto may be output at the second output.

The gradient pulse amplifier unit enables, for example, generation of such a strong gradient field in a magnet space of the gradient pulse amplifier that a heartbeat of a person situated therein may be affected in the case of a hardstop.

The at least one gradient coil generates a magnetic gradient field in the magnet space. Gradients may be generated separately (e.g., in all spatial directions) by a plurality of gradient coils. Thus, for example, three gradient coils may be available for the three Cartesian spatial directions x, y and z. The gradient coils may be connected, for example, to center ports of the H-bridge.

In one embodiment, the switching elements of the end stage are semiconductor switches (e.g., power semiconductors such as power MOSFETs, IGBTs, etc.). The lockout switches and the feeder circuit breakers are or include, for example, one or more semiconductor switch(es), also including, for example, driver modules and/or digital gates.

The shut-off signals may be output, for example, by monitoring units to the gradstop unit.

In one embodiment, the gradstop unit actuates the feeder circuit breakers at least for a specified duration of the softstop current reduction $t_{soft}$. This consequently provides, for example, on actuation of the end stage for a "softstop", that sufficient time is provided for a current reduction in the gradient coil, so no critical patient stimulation occurs even when the new actuation pattern is subsequently cancelled.

The functional sequence of the method may therefore be expanded by the act of (4) maintaining the actuation pattern via the gradstop unit at least for the duration of the softstop current reduction $t_{soft}$.

In one embodiment, following act (4), the gradstop unit cancels the new actuation pattern again by deactivating or not actuating the feeder circuit breakers. As a result, in the event of failure of the modulator or if the shut-off signal remains present, the switching elements of the end stage are actuated with a shut-off pattern, which corresponds to a "hardstop", but without a critical stimulation being generated in the patient.

In one embodiment, the gradstop unit actuates the feeder circuit breakers via the gradstop unit delayed by a safety time $t_{tot}$ with respect to the lockout switches. As a result, this has the advantage that high short-circuit currents in the end stage due to switching over of the switching elements are avoided via the gradstop unit.

In one embodiment, resetting of the gradstop unit is prevented for the duration of the softstop current reduction $t_{soft}$. The advantage is thus achieved that even with only briefly generated shut-off signals, the gradstop unit generates its new actuation pattern. This is advantageous if the new actuation pattern generates a "softstop" since then the "softstop" may be carried out in a defined manner and the end stage does not go into an undefined switching state. This may be implemented, for example, such that shut-off signals are stored in the gradstop unit (e.g., by setting a flip-flop or a different bistable circuit) and may only be reset by a reset signal, and the reset signal is functionally blocked in the gradstop unit for the duration of the softstop current reduction $t_{soft}$.

As another example, an MR system, having a system controller and a gradient pulse amplifier unit, is provided. The gradient pulse amplifier unit has at least one end stage connected to a gradient coil with, in each case, a plurality of switching elements, a modulator for actuating the switching elements of the end stage, and lockout switches interconnected in the signal paths from the modulator to the switching elements. The lockout switches, when operated, lock out the associated signal paths. The gradient pulse amplifier unit also includes feeder circuit breakers interconnected in at least some signal paths from the modulator to the switching elements. The feeder circuit breakers are connected in the associated signal paths downstream of the lockout switches and, when operated on the associated signal paths, apply an actuation signal to the switching elements connected to these signal paths. The gradient pulse amplifier unit includes a gradstop unit with at least one input for receiving at least one shut-off signal, a first output for operating the lockout switches, and a second output for operating the feeder circuit breakers. The MR system is configured to carry out the method as described above. The MR system may be developed analogously to the method, and vice versa, and has the same advantages. In one embodiment, each end stage has four switching elements connected together as an H-bridge. The four switching elements are switched by respective power drivers. The power drivers are connected by respective signal paths to associated modulator outputs of the modulator. A lockout switch is interconnected in each of the four signal paths, and respective feeder circuit breakers are interconnected in two of these signal paths, which run to switching elements that are connected to a shared pole of a power supply unit. A possibility that is particularly simple to implement structurally and is reliable is thus provided for actuating an end stage (e.g., for carrying out a "softstop"). The first pole may be, for example, a positive pole of a DC connector of the end stage, while the second pole is a negative pole, or vice versa.

In one embodiment, four lockout switches in the form of OR gates (e.g., digital OR gates) are connected by one input to an associated modulator output and by a different input to the first output of the gradstop unit, and two feeder circuit breakers in the form of AND gates (e.g., digital AND gates) that are in each case connected by one input to an output of a lockout switch connected upstream and by a different input to the second output of the gradstop unit, and an output connected for signaling to an associated switching element of the end stage. An actuation of the end stage for a "softstop" may thus be particularly easily implemented. In this embodiment, lockout switches in the form of OR gates are therefore interconnected in all four signal paths running from the modulator to the switching elements of an end stage. The OR gates lock out on receipt of a shut-off signals via the gradstop unit. Feeder circuit breakers in the form of AND gates are also interconnected in two of the four signal paths, and, more precisely, in each case connected downstream of the lockout switches (OR gates) of these signal paths. The signal paths provided with the feeder circuit breakers run to the two switching elements, which are connected to a shared pole of a power supply unit. If the lockout switches are actuated by the gradstop unit, all switching elements of the end stage are switched off. If, in addition, the feeder circuit breakers are actuated, a switch-on signal is applied to the associated signal lines for the two switching elements switched thereby, so these are switched on. As a result, the switching elements of the end stage are brought into switch positions, which correspond to a "softstop". As a result, for example, a "softstop" may be triggered in the event of a failure of the modulator or a different breakdown.

During normal operation, the end stage may generate an output voltage for the power supply of an associated gradient coil in that the switching elements connected to a shared pole or to power drivers of a similar type are not simultaneously switched so as to conduct or lock out, and the switching elements connected to the other pole or to the power drivers of a different type are conversely switched to be blocking or conducting. During normal operation, the end stage may generate an output voltage of zero at the associated gradient coil in that, alternately, the switching elements connected to a shared pole or to power drivers of a similar type (e.g., inverting or non-inverting) are simultaneously switched so as to conduct or lock out and the switching elements connected to the other pole or to the power drivers of a different type (e.g., non-inverting or inverting) are conversely simultaneously switched as to lock out or conduct.

In one embodiment, four lockout switches interconnected in respective signal paths are present in the form of "self-conducting" modulator signal drivers with respective enable inputs that are connected to the first output of the gradstop unit and two feeder circuit breakers in the form of diodes, which are connected at the anode side to an output of an associated modulator signal driver and at the cathode side to the second output of the gradstop unit. Actuation of the end stage for a "softstop" may thus be structurally implemented particularly easily using modulator signal drivers. The modulator signal drivers serve to amplify the signal output at the associated modulator outputs. "Self-conducting" modulator signal drivers are characterized in that the "self-conducting" modulator signal drivers lock out when corresponding enable inputs are actuated by the shut-off signal, without actuation of the enable inputs they conduct. The diodes may be connected (e.g., at the cathode side) to the second output of the gradstop unit such that when an actuation signal is present at the second output, the cathode side of the diodes is present at a reference potential (e.g., ground), and as a result, a switch-on signal is generated for the switching elements connected to the corresponding signal paths of the end stage.

It is also possible to combine the two last-mentioned embodiments (e.g., via an embodiment of the lockout switches as OR gates with circuit breakers in the form of diodes or lockout switches in the form of self-conducting modulator signal drivers connected downstream), with respective enable inputs and optionally feeder circuit breakers in the form of AND gates connected downstream, etc.

It is basically also possible to equip all signal paths with circuit breakers that may be individually actuated by the gradstop unit, so any desired actuation pattern may be generated.

It is one embodiment, the gradstop unit has a timer (e.g., "maintenance timer") that is adapted to output an actuation signal for the feeder circuit breakers for the duration of the softstop current reduction $t_{soft}$ in response to a receipt of a shut-off signals at the second output and the first output is connected upstream of the maintenance timer. This thus results in the advantage that it is provided in a structurally simple manner that the actuation pattern for the switching elements of the end stage modified via the feeder circuit breakers is maintained for a sufficiently long time to maintain a "softstop" until an uncritical current is attained in the gradient coil.

In one embodiment, the gradstop unit has a timer (e.g., "delay element") that is adapted to delay the shut-off signal by the safety time trot, the first output is connected upstream of this timer, and the second output is connected downstream of this timer. This delay of the actuation of the feeder circuit breakers with respect to an actuation of the lockout switches may prevent a bridge short-circuit when switching over the switching elements of the end stage and consequently damage to the end stage is reliably prevented. In one embodiment, the one output of the delay element is connected to an input of the maintenance timer (e.g., the maintenance timer is connected downstream of the delay element).

In one embodiment, the gradstop unit has a memory or memory chip (e.g., a flip-flop or a different type of bistable gate) that has at least one input for receiving at least one shut-off signal and a reset input. The memory or memory chip is configured to store a shut-off signal and forward the shut-off signal until a reset signal is received at the reset input. This results in the advantage that even in the case of only briefly generated shut-off signals, the gradstop unit may output a longer-lasting actuation signal at its first output, and this supports reliable locking out of the modulator outputs for carrying out a "softstop". The at least one input of the memory chip may be connected, for example, to outputs of monitoring units.

In one embodiment, the gradstop unit has a timer (e.g., "minimum switch-off timer") connected at the input side to the output of the memory chip. The timer is configured to forward the shut-off signal output by the memory chip and to block a reaction of the memory chip to a reset signal for a minimum switch-off duration $t_{off}$. The advantage is thus achieved that the gradstop unit outputs an actuation signal with at least the minimum switch-off duration $t_{off}$ to the lockout switches, and, more precisely, also for the case that a reset signal arrives at the memory chip before implementation of a sufficiently long "softstop". For example, $t_{off} \geq t_{soft}$ applies in this case. In one embodiment, the output of the memory chip corresponds to the first output of the gradstop unit. In one embodiment, the maintenance timer and/or the delay element is connected downstream of the minimum switch-off timer.

In one embodiment, at least the gradstop unit may be supplied with electrical energy by a voltage supply facility. The voltage supply facility has an energy store, downstream of which a voltage regulator is connected. The advantage is thus achieved that an actuation pattern may be applied by the gradstop unit to the end stage even for the case where a power failure occurs in the gradient pulse amplifier unit since for this case too the energy store has also stored sufficient energy to operate the gradstop unit.

In one embodiment, an electrical isolation facility is present in the signal paths between the lockout switches or the feeder circuit breakers and the switching elements of the end stage. In one embodiment, the voltage supply facility is also provided for the power supply of at least the transmission side of the electrical isolation facility.

BRIEF DESCRIPTION OF THE DRAWINGS

For the sake of clarity, same or same acting elements are provided with same reference characters.

DETAILED DESCRIPTION

Figure 1:
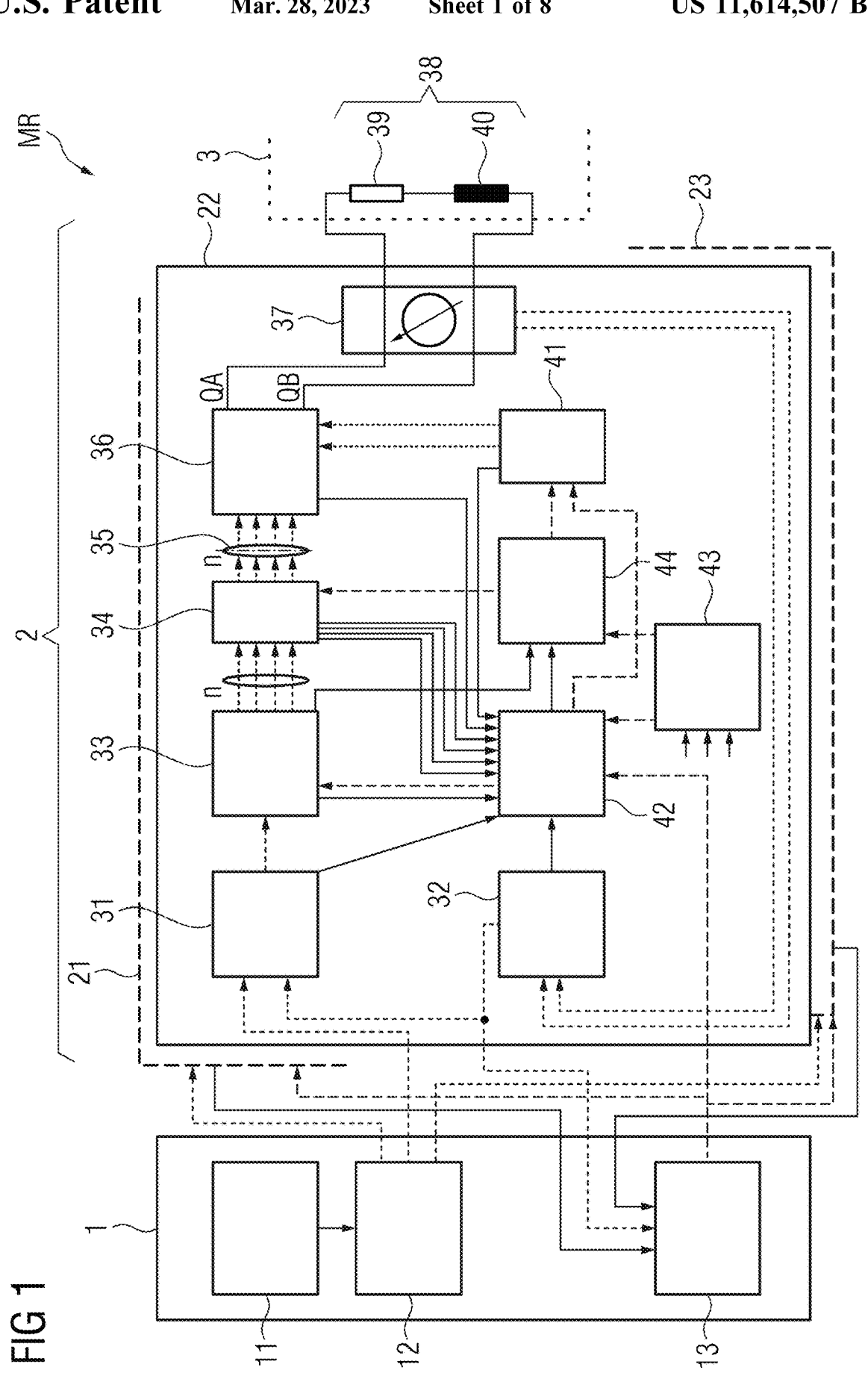
FIG. 1 shows, as a functional diagram, components of one embodiment of a magnetic resonance (MR) device for generation of a gradient field including a gradient pulse amplifier unit.

FIG. 1 shows, as a functional diagram, components of one embodiment of a magnetic resonance (MR) system MR for generation of a gradient field, including a system controller 1 and a gradient pulse amplifier unit 2.

A sequence controller 11 is available in the system controller 1, and this generates the specifications for RF pulses and gradient pulses. The specification for the gradient pulses is converted by a desired value generation facility 12 into desired values for the three gradient axes. For this, the desired values are transferred in an axis-based manner to gradient amplifier apparatuses 21 (e.g., for the x-gradient), 22 (e.g., for the y-gradient), and 23 (e.g., for the z-gradient) of the gradient pulse amplifier unit 2. In FIG. 1, the axis-based gradient amplifier apparatuses 21, 22, 23 are illustrated as separate units, but the axis-based gradient amplifier apparatuses 21, 22, 23 may also be combined into one unit.

Inside one of the gradient amplifier apparatuses 21, 22, 23 (illustrated here by way of example on the basis of gradient amplifier apparatuses 22), a respective control unit 31 has an input for the desired value generated by the desired value generation facility 12. A further input of the control unit 31 receives an actual current value from an actual value amplifier 32. A manipulated variable for a modulator 33 is generated at a signal output of the control unit 31. The modulator 33 generates pulse width-modulated actuation signals for an end stage 36. The end stage 36 is composed, for example, of at least one H-bridge circuit of circuit breakers SE1 to SE4 (e.g., IGBTs, see FIG. 2 to FIG. 4), with the end stage 36 receiving respective actuation signals for each of the circuit breakers SE1 to SE4. The actuation signals are transferred free of potential to power drivers of the H-bridge. An electrical isolation apparatus 35 is provided for this, which may use, for example, optocouplers.

An actuation driver stage 34 is provided so the modulator 33 having, for example, a Field Programmable Gate Array (FPGA) or a different logic module is relieved of the actuation current of the electrical isolation apparatus 35. An input of the actuation driver stage 34 provides that all actuation signals may be set to the "off" state thereby, and this causes all circuit breakers SE1 to SE4 in the end stage 36 to lock out. A power supply unit 41 serves to supply power to the end stage 36.

The associated axis-based gradient coil 38 is connected in the magnet space 3 to the outputs QA, QB of the end stage 36 by a current measuring unit 37. The gradient coil 38 has an inductor 40 and an ohmic resistor 39.

A gradient current is measured, for example, twice in the current measuring unit 37. These measuring signals are evaluated by the actual value amplifier 32, which forms an actual value for the control unit 31 therefrom.

A monitoring unit 42 is provided for the operational safety of the gradient pulse amplifier unit 2. The monitoring unit 42 evaluates numerous monitoring signals: the monitoring unit 42 thus obtains a message from the actual value amplifier 32 as to whether the current actual value is plausible in relation to the two measuring signals of the current measuring unit 37 and whether a maximum current actual value is not overshot. From the control unit 31, the monitoring unit 42 receives a signal about the size of the control difference (e.g., the deviation between desired value and actual value), as well as a level of a manipulated variable for the modulator 33. Information may be provided by the modulator 33 about whether the control circuit is oscillating. From the monitoring of the outputs of the actuation driver stage 34, it is possible to derive whether the end stage 36 is being actuated with the correct switching frequency and whether the actuation signals for the end stage 36 do not contain an actuation for the bridge short-circuit. From the end stage 36, the monitoring unit 42 also receives, for example, information about an end stage temperature.

To protect the patient against nerve stimulation (e.g., Peripheral Nerve Stimulation (PNS)), a further monitoring facility 13 is provided, which is illustrated here purely by way of example as a constituent part of the system controller 1. The arrangement of the monitoring facility 13 in the system controller 1 has a number of advantages: monitoring thresholds may thus be easily specified by the system controller 1, and a rough pre-calculation of the gradient desired values for the monitoring facility 13 enables a statement to be made as to whether the pulse sequence with the chosen settings will remain within the specified monitoring limits, and, more precisely, even before the user has started the relevant sequence.

For the actual PNS monitoring, the monitoring facility 13 receives the current actual values of the actual value amplifier 32 of the axis-based gradient amplifier apparatuses 21, 22, and 23. It should be assumed in this case that I~G~B applies (e.g., the gradient current I is proportional to the gradient G, and this is proportional to a flux density B in the gradient coil 38 caused by the gradient G). If the overlaying and assessment over time of the current actual values results in a limit value being overshot, the monitoring unit 13 sends a shut-off signal to the monitoring unit(s) 42. The monitoring unit 42 may be available for all gradient amplifier apparatuses 21, 22, and 23 as a single unit; however, a separation into one monitoring unit each for the gradient amplifier apparatuses 21, 22, and 23 may be possible.

The modulator 33 may be an axis-overarching module, even if many calculations and functions are to proceed axis-specifically. This allows the use of a shared clock signal ("clock") for the FPGAs of the respective modulators 33, a shared signal for ending the actuation of the end stages 36, a shared signal for switching the power supply units 41 on and off, and shared supply voltages for many parts of the electronic devices of the gradient amplifier apparatuses 21, 22, and 23.

From the end stages 36 and the power supply unit 41, the monitoring unit 42 receives monitoring signals on the level of the voltages for the power drivers for actuating the H-bridges in the end stages 36, and on the level of the power supply voltages of the end stages 36 generated by the power supply unit 41.

All further supply voltages (e.g., +/−15 V) for the actual value amplifier 32 and the current sensors in the current measuring unit 37, +5 V for the modulator signal drivers 342 (see FIG. 5 and FIG. 6) in the actuation driver stage 34, the supply voltages of the FPGAs of the modulator 33 and the clock generation are monitored in a voltage monitoring facility 43. The voltage monitoring facility 43 has two outputs, of which one leads to the monitoring unit 42 and the other leads to a monitoring unit 44. While the monitoring unit 42 may have an FPGA, or a logic module that acts in the same way, which requires a plurality of supply voltages and, for many functions, a clock signal, the monitoring unit 44 has an unclocked digital part that is present at only one digital supply voltage, which may correspond, moreover, to the supply voltage of the actuation driver stage 34.

The supply voltages may be monitored with respect to at least two tolerance windows in the voltage monitoring facility 43 (e.g., using a first tolerance window with a first tolerance threshold of 0.7 V (the first tolerance window is +/−0.7 V) and using a second tolerance window with a second tolerance threshold of 0.9 V (the second tolerance window is +/−0.9 V) at a standard voltage of +15 V). The first, narrower tolerance window is dimensioned such that the first tolerance window may illustrate that there is a fault in a supply voltage, but at the same time the fault is not so great that the electronic devices affected by this supply voltage will no longer function. If the further tolerance window is overshot, it is to be anticipated that parts of the electronic devices will accordingly no longer work, and this may have very severe consequences specifically in the case of the FPGAs in the control unit 31, the modulator 33, and the monitoring unit 42 (e.g., failure thereof). Malfunctioning of the modulator 33 may cause a disruptive actuation of the end stage 36; it would similarly be possible that an actuation that stimulates the patient is generated. Malfunctioning of the monitoring unit 42 may cause both the failure of this monitoring and a shutoff owing to the PNS limit being overshot.

If only the narrower tolerance limit is reached, the monitoring unit 42 receives a shut-off signal, and the monitoring unit 42 outputs a shut-off signal to the modulator 33. If, by contrast, the further tolerance limit is also reached, a fault signal or shut-off signal is thus also made to the monitoring unit 44, from which the shut-off command is then output to the actuation driver stage 34. The monitoring unit 44 also checks whether the FPGAs are configured and whether, for example, the clock frequency for the FPGAs lies in the permitted frequency range. If the monitoring unit 44 establishes that the conditions necessary for the functioning of the FPGAs are not being adhered to, the shut-off signal is likewise generated for the actuation driver stage 34.

The shut-off command of the monitoring unit 42 to the modulator 33 causes the modulator 33 to actuate the end stage 36 in accordance with a "softstop". The shut-off command of the monitoring unit 44 to the driver stage 34, by contrast, causes the immediate locking out of all switching elements SE1 to SE4 of the end stage 36 and therewith a "hardstop".

In the MR system MR in FIG. 1, the single unit, which may generate a "softstop", is thus the modulator 33. This is indeed monitored by the monitoring facilities or apparatuses 42, 43 and 44, but in the event of a fault of the modulator 33, these may only trigger a hardstop by way of the actuation driver stage 34.

Figure 2:
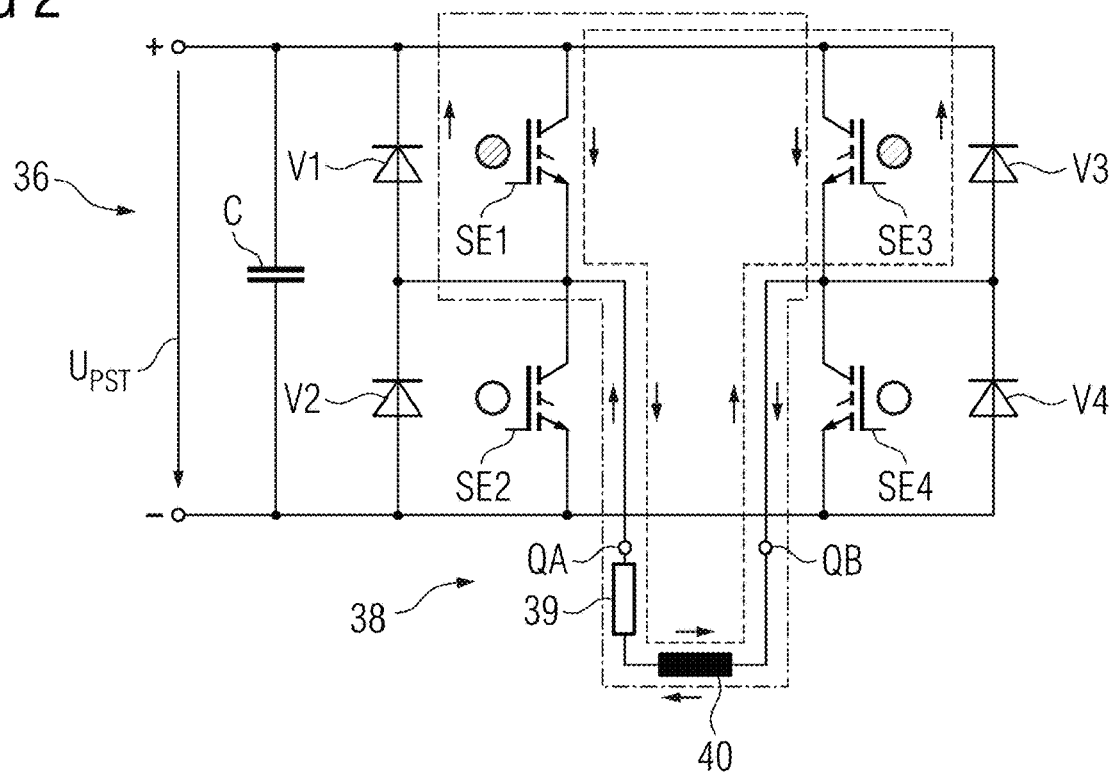
FIGS. 2 to 4 show a circuit diagram of one embodiment of an end stage of the MR device in FIG. 1 in different switch positions.
Figure 3:
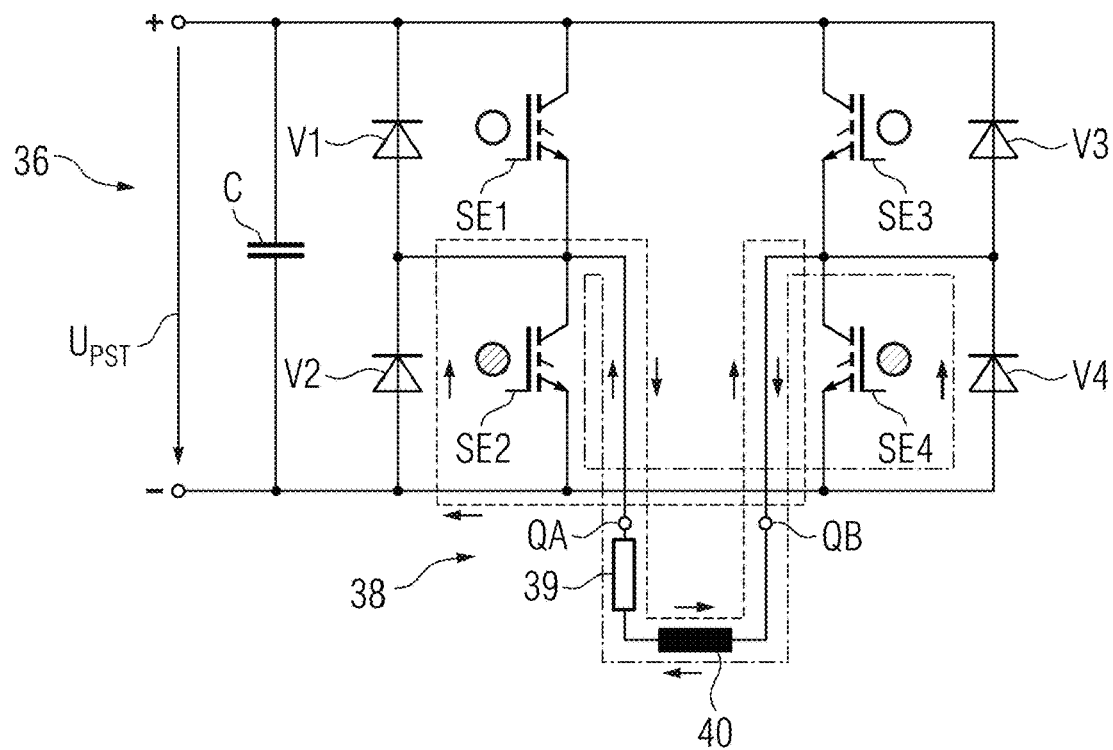
Figure 4:
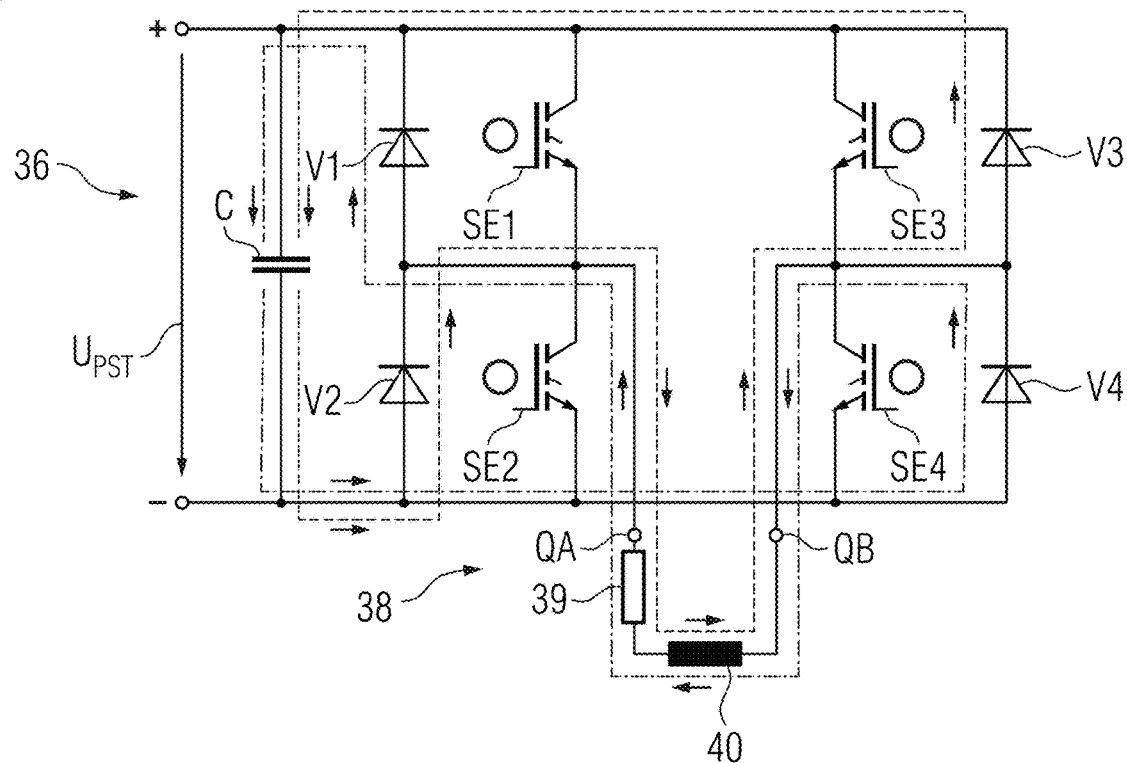

FIG. 2 to FIG. 4 show one possible circuit diagram of an end stage 36, which (e.g., a partial end stage), purely by way of example, has a single H-bridge. The H-bridge includes as circuit breakers the switching elements SE1 to SE4 (e.g., illustrated in each case by the symbol of an IGBT), diodes V1 to V4, and a capacitor C that keeps a voltage $U_{PST}$ of the end stage 36 substantially constant in the case of fluctuations in load. The H-bridge has outputs QA and QB to which the at least one gradient coil 38 is connected for a gradient axis. The power supply including the power supply unit 41 for providing the voltages $U_{PST}$, as well as the power drivers 8 (see FIG. 3A), which switch the switching elements SE1 to SE4 via corresponding gate connections on and off are not illustrated.

If the end stage 36 is a partial end stage including a series circuit of a plurality of partial end stages, the output QB of the first partial end stage is connected to the output QA of the second partial end stage, the output QB of the second partial end stage is connected to the output QA of the third partial end stage, etc. The gradient coil 38 is connected to the output QA of the first partial end stage and the output QB of the last partial end stage.

In FIG. 2, the switching elements SE1 and SE3 connected to the positive pole of the power supply unit are switched on, as indicated by the circle filled in black, and the switching elements SE2 and SE4 connected to the negative pole of the power supply unit are switched off, as indicated by the empty circle. A current flowing in the gradient coil from output QA to output QB, which is driven by the inductor 40 of the gradient coil 38 (indicated by the dotted line), finds its way through the diode V3, the switched-on switching element SE1, and the resistor 39 to the inductor 40. In the opposite direction (indicated by the dot-dash lines), the current finds its way through the resistor 39, the diode V1, and the switching element SE3 back to the inductor 40. Overall, a voltage occurs at the inductor 40, which corresponds to the sum of the voltages at the resistor 39, a diode voltage, and the voltage of a switched-on switch element. In the case of high currents, the semiconductor voltages at the switching elements SE1 to SE4 and the diodes V1 to V4 are negligible. The voltage then approximately corresponds to the voltage at resistor 39.

In FIG. 3, the switching elements SE2 and SE4 are switched on, but the switching elements SEI and SE3 are switched off, as indicated by the corresponding circles. With respect to the current flow, the same number of diode and switching element voltages are obtained as in FIG. 2A, and therewith, also the same voltage at resistor 39.

A current flowing in the inductor 40 is reduced by the sum of these voltages. With a high current, the current reduces in accordance with an e-function with the time constant T=L/R where L corresponds to the inductance value of the inductor 40 and R corresponds to the resistance values of the ohmic resistor 39. The greater L is and the smaller R is, the greater the time constant T and the slower or less steeply the current reduction is.

FIG. 2 and FIG. 3 correspond to a softstop state of the end stage 36.

In FIG. 4, all switching elements SE1 to SE4 are switched off. The current accordingly flows through the diode V3, through the capacitance C, which is charged in the process, through the diode V2 and through the resistor 39; in the reverse direction, the current flows through the resistor 39, the diode V1, the capacitance C, and the diode V4. If the semiconductor voltages are ignored in the case of a high current, the voltage at the inductor 40 corresponds to the sum of $U_{PST}$ and the voltage at the resistor 39. Since the voltage at the resistor 39 is small compared with $U_{PST}$, and $U_{PST}$ is kept almost constant by the capacitance C, the current reduces substantially linearly. This corresponds to a hardstop state.

The following thus approximately applies for the steepness of the current reduction in the case of a "softstop":

$$dI/dt = R \cdot I/L$$

where I corresponds to the gradient current, and in the case of a hardstop:

$$dI/dt = (U_{PST} + (R \cdot I))/L \cdot U_{PST}/L$$

With a series circuit of n partial end stages, these considerations apply accordingly: the number of semiconductors through which current flows is n-fold, and the total end stage voltage is $n \cdot U_{PST}$.

The current steepness in the case of a hardstop is thus higher by the amount $n \cdot U_{PST}/L$ than in the case of a softstop. Accordingly, the change in the speed of the magnetic flux density generated by the gradient, dB/dt, is low in the case of a "softstop" compared to the hardstop.

While a current reduction in the case of a hardstop typically occurs in the order of magnitude of 0.2 ms to 1 ms (e.g., "duration of the hardstop current reduction" $t_{Hard}$), in the case of a "softstop", current strengths, which may be assumed to be no longer relevant (e.g., "duration of the softstop current reduction" $t_{soft}$) are achieved only after typically 5 ms to 40 ms.

Figure 5:
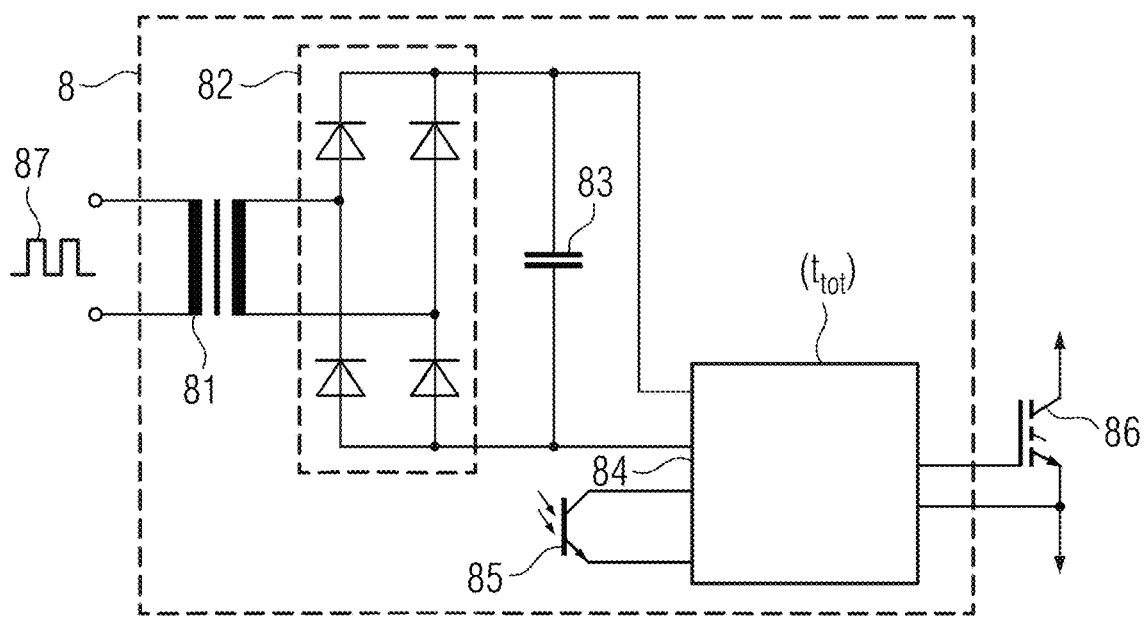
FIG. 5 shows a circuit diagram of one embodiment of a power driver for switching a switch element of the end stage in FIGS. 2 to 4.

FIG. 5 shows one possible power driver 8 of the end stage 36 for switching one of the switching elements SE1 to SE4, designated here as switching element 86. The power driver 8 is supplied with an alternating signal 87 via a transmitter or transformer 81. A secondary-side alternating signal is rectified by a rectifier 82 and smoothed by a capacitor 83 in the power driver 8. The voltage of the capacitor 83 supplies the further electronic devices 84 of the power driver 8.

The power driver 8 is actuated by a receiver 85 of a galvanically isolating signal transmission (e.g., of an optocoupler or a fiber optic conductor section) configured, by way of example, as a photodiode, a transmitter of which is a constituent part of the electrical isolation apparatus 35. The power requirement of the power driver 8 is primarily determined by the losses to the constant reloading of the gate capacitance of the switch element 86 with specified switching frequency. With a static actuation (as occurs, for example, in the case of "softstop"), the current consumption is, by contrast, very low.

The following usually applies to the actuation of the power driver 8: if the receiver 85 receives an "on" signal (e.g., light "on" or "high" level), the switching element 86 is switched on. If the receiver 85 does not receive an "on" signal (e.g., no light, corresponding to a "low" level), the switching element 86 is switched off.

As soon as in the case of an H-bridge including four power drivers 8 and four switching elements 86 (e.g., the switching elements SE1 to SE4), the receiver 85 does not receive an actuation, all switching elements 86 are switched off, and the H-bridge is in the hardstop. If the H-bridge is a partial end stage of an end stage, which is composed of a plurality of partial end stages connected in series, the complete end stage is thus in the hardstop if its receiver 85 does not receive an actuation.

The capacitance of the capacitor 83 may be dimensioned such that if the alternating voltage 87 supplying the power fails, the switching element 86 may be switched with normal switching frequency at least for the reaction time of the voltage monitoring facilities 43; thereafter, energy is still available for at least a switch-on process, and the last statically switched-on state of the switch element 86 is maintained for at least the duration of the softstop current reduction $t_{soft}$.

One problem consists in that if the actuation of the receiver 85 fails, all switching elements 86 or SE1 to SE4 of the end stage 36 are locked out, and thus, a hardstop is performed.

Figure 6:
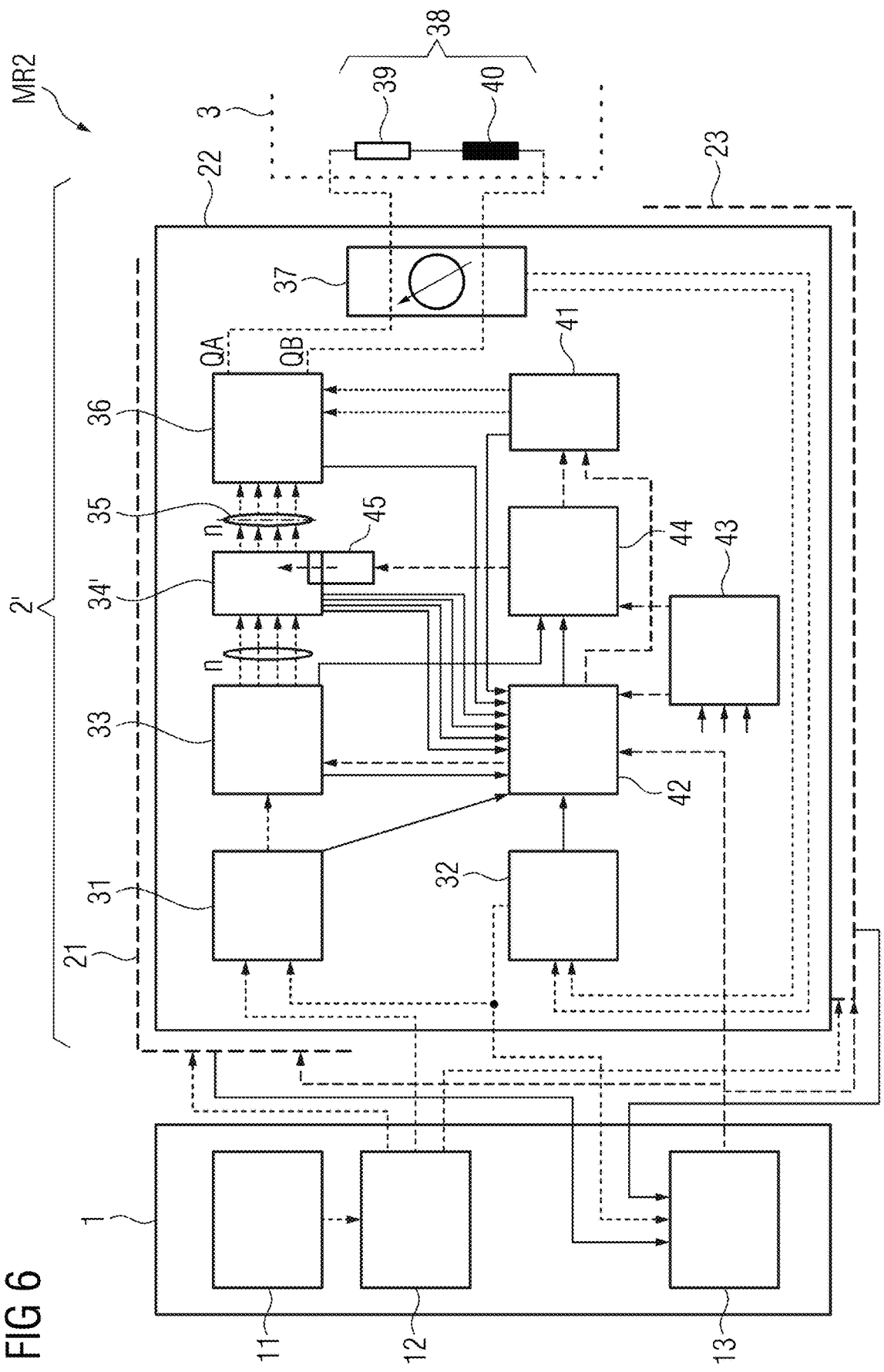
FIG. 6 shows, as a functional diagram, components of one embodiment of an MR device for generation of a gradient field including a gradient pulse amplifier unit, which is expanded by a gradstop unit compared to the MR device in FIG. 1.

FIG. 6 shows, as a functional diagram, components of one embodiment of an MR system MR2 for generation of a gradient field with a modified gradient pulse amplifier unit 2', which is additionally expanded by a "gradstop unit" 45 that is linked to a modified actuation driver stage 34' and is controlled by the monitoring unit 44. The gradstop unit 45 serves to provide an additional possibility for preventing a "hardstop," for example, in the case of failure of the modulator 33.

The basic functional sequence of the gradstop unit 45 may include, for example, that
(1) the gradstop unit 45 receives a shut-off signal from the monitoring unit 44;
(2) the gradstop unit 45 then locks out all outputs of the actuation driver stage 34' to the electrical isolation unit 35 and therewith to the end stage 36; and
(3) a (new) actuation pattern for the end stage 36 is generated by the gradstop unit 45, and the actuation pattern corresponds to a "softstop" and is applied to the electrical isolation unit 35.

The actuation pattern of the gradstop unit 45 thus "replaces" the actuation pattern generated by the actuation driver stage 34'.

The new actuation pattern generated by the gradstop unit 45 may include, for example, a specified switching status of the switching elements SE1 to SE4, which corresponds to a "softstop" (e.g., such that the switching elements SE1 to SE4 are actuated in accordance with SE1 "on", SE2 "off", SE3 "on", and SE4 "off"), and this corresponds to the switch positions shown in FIG. 2 (e.g., "upper softstop"). The low-stimulation shutoff in accordance with "softstop" is already achieved with this sequence. Alternatively, the switching elements SE1 to SE4 may be actuated such that the switch positions shown in FIG. 3 (e.g., "lower softstop") are assumed.

It is not imperative in this case that the new actuation pattern is applied to the end stage 36 for a relatively long time, but only for the duration of the softstop current reduction $t_{soft}$.

The functional sequence may consequently be expanded by the following acts:
(4) maintaining the actuation pattern via the gradstop unit 45 at least for the duration of the softstop current reduction $t_{soft}$ and subsequently
(5) cancelling the actuation pattern via the gradstop unit 45, so the actuation pattern generated by the actuation driver stage 34' is impressed onto the end stage 36 again. As a result, there is a transition to a "hardstop" if the modulator fails, but, owing to acts (3) and (4), this no longer generates a critical stimulation in the patient.

For example, after the outputs of the actuation driver stage 34' have been locked out by the gradstop unit 45 in act (2) and before the new actuation pattern has been generated by the gradstop unit 45 in act (3), it is possible to wait for a dead time or safety time $t_{tot}$ of, for example, a few nanoseconds. This results in the advantage that no short-circuit actuation of the end stage 36 occurs on a change in the actuation.

The safety time $t_{tot}$ for switching on the switching elements SE1 to SE4 may be chosen to be as short as possible, so an adverse effect on the linearity of the end stage 36 is as low as possible. Without safety time $t_{tot}$, large short-circuit currents may occur in the end stage 36. By way of example, it is assumed the state "on" changes from the switching element SE2 to the switching element SE1, so the switching element SE2 is switched off and the switching element SE1 is switched on. If the switching element SE2 is not yet fully switched off, while the switching element SE1 has already achieved the "on" state, a short-circuit current and a high switching loss occurs therewith.

If the safety time $t_{tot}$ is too long, the switching element SE2 has already been switched off long before the switching element SE1 is switched on and the end stage 36 consistently adopts the state according to FIG. 4 on switching over (e.g., that each switchover process is accompanied by a brief current reduction of maximum steepness). The relationship of the manipulated variable of a modulator input to the output voltage of the end stage 36 will be non-linear accordingly in the case of excessively long safety times $t_{tot}$.

Figure 7:
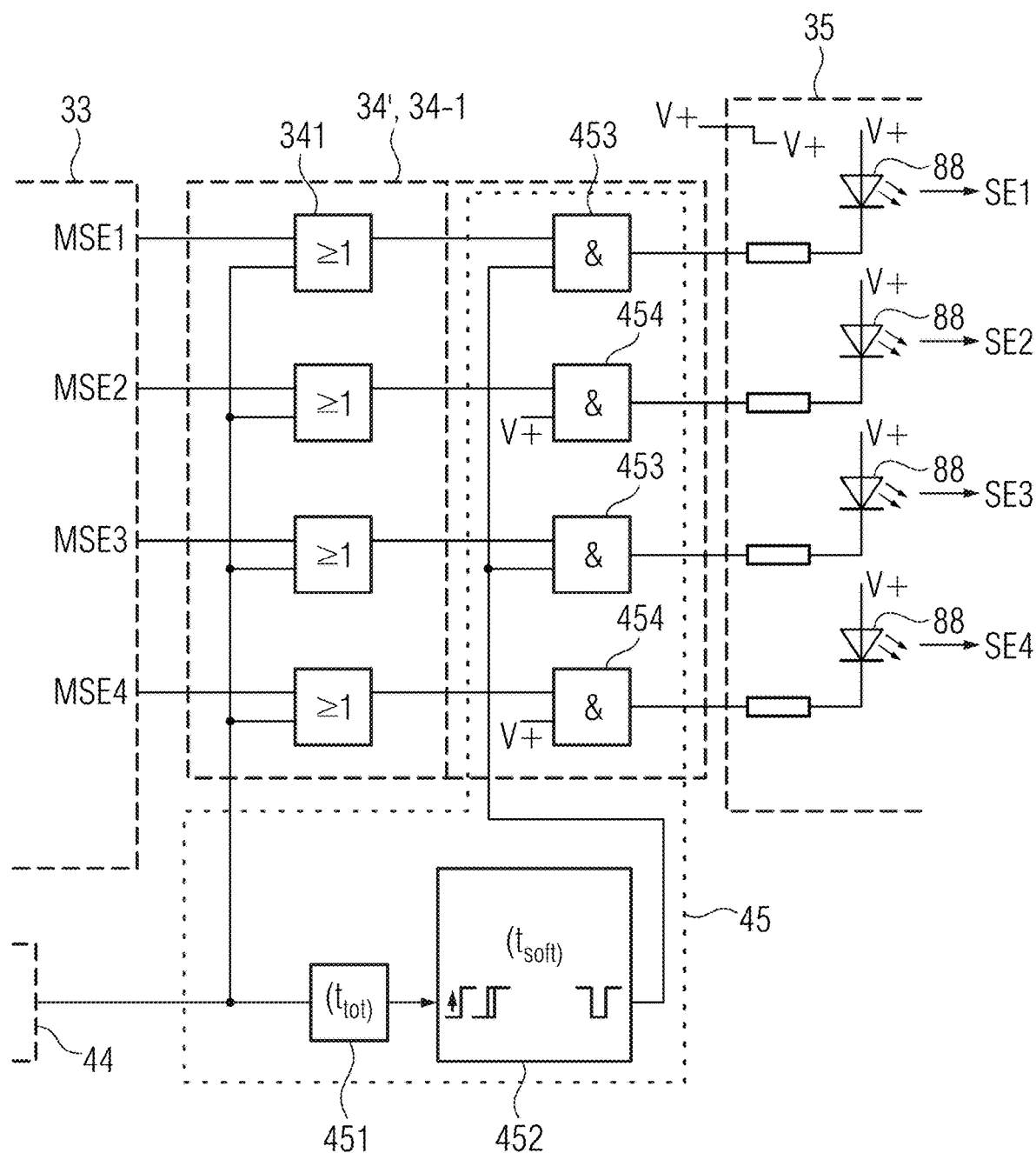
FIG. 7 shows one possible circuit diagram of components of the MR device in FIG. 6 including the gradstop unit.

FIG. 7 shows one possible variant of the combination of gradstop unit 45 and the actuation driver stage 34' in a variant 34-1 that is adapted to carry out the sequence for actuation of an end stage 36 described in relation to FIG. 6. It is assumed in this case that digital gates 453 and, if available, digital gates 454 may provide an adequate output current for actuating the transmitting light-emitting diodes 88 of the electrical isolation unit 35 drawn purely by way of example here. The light signal emitted by the light-emitting diodes 88 is received by the receivers 85 (e.g., photodiodes) via a light cable (e.g., fiber-optic cable). Further, it should be assumed that a "low" level at an input of the electrical isolation apparatus 35 causes the relevant light-emitting diodes 88 to illuminate (e.g., since then an operating current for operating the light-emitting diodes 88 may flow through), and as a result, an associated switching element SE1 to SE4 of the end stage 36 is switched on. A "low" level at the input of the electrical isolation apparatus 35 is generated during normal operation from a "low" level of a corresponding output of the modulator 33.

V+ designates a supply voltage present at the anode side of the light-emitting diodes 88. This supply voltage V+ may also supply the modulator 33, the monitoring unit 44, and/or the gradstop unit.

A "high" level of the supply voltage V+ of the monitoring unit 44 corresponding to a shut-off signal is led in the gradstop unit 45 (alternatively also directly) via a branch to a first output of the gradstop unit 45) and sets the outputs of lockout switches in the form of digital OR gates 341 inside the actuation driver stage 34-1 to "high". The OR gates 341 are connected downstream of corresponding modulator outputs MSE1 to MSE4 of the modulator. As a result, the outputs of all OR gates 341 are set to "high", and, more precisely, independently of which signal level is present at the modulator outputs MSE1 to MSE4. In this sense, the modulator outputs MSE1 to MSE4 or the signal paths between the modulator outputs MSE1 to MSE4, and the switching elements SE1 to SE4 at the OR gates 341 are functionally locked out since changes to the signal levels of the modulator outputs MSE1 to MSE4 no longer influence the output signals of the OR gates 341. The outputs of the OR gates 341 are connected to an input of respective digital AND gates 453.

The shut-off signal of the monitoring unit 44 is also fed to a delay element 451 of the gradstop unit 45, which may be, for example, a simple low-pass RC element. After a brief delay by the safety time $t_{tot}$ has expired in the delay element 451, the high level reaches a maintenance timer 452 of the gradstop unit 45 connected downstream of the delay element 451. Since an edge steepness of the shut-off signal at the input of the maintenance timer 452 is typically decreased by the delay element 451, a Schmitt trigger input is advantageous for the maintenance timer 452.

The maintenance timer 452 reacts to the rising edge at its input with a "low" pulse at its output, which corresponds to a second output of the gradstop unit 45. Outputs of feeder circuit breakers in the form of digital AND gates 453 will become "low" due to this low pulse, so the outputs thereof similarly lie at a "low" level. As a result, a potential gradient is generated in the conducting direction at the light-emitting diodes 88 of the electrical isolation unit 35, and this causes the light-emitting diodes 88 to switch on. Since the light-emitting diodes 88 cooperate with the receivers 85, the switching elements SE1 and SE3 become conductive in the subsequent end stages 36 or are switched on (corresponding to the "upper softstop" shown in FIG. 2). The switching elements SE2 and SE4 remain switched off since there are no AND gates 453 available in their signal paths. An "upper softstop" corresponding to the switching status shown in FIG. 2 is generated by this new actuation pattern, therefore.

Once the duration of the softstop current reduction $t_{soft}$ has expired, the second output of the maintenance timer 452 is set to "high" again, so the associated switching elements SE1 and SE3 are locked out again; this corresponds to a transition, but one which is no longer critical for a stimulation owing to the current reduction during the "softstop" phase, to the hardstop shown in FIG. 4.

Optional digital AND gates 454 compensate the runtime caused by the AND gates 453 but may also be replaced, for example, by lines of OR gates 341 to corresponding inputs of the electrical isolation 35 if the runtime of the AND gates 453 is very short. The AND gates 453 and 454 may be regarded both as constituent parts of the actuation driver stage 34-1 and of the gradstop unit 45.

This switching arrangement of the actuation driver stage 34-1 may be continued accordingly for a plurality of end stages 36 (e.g., partial end stages).

Figure 8:
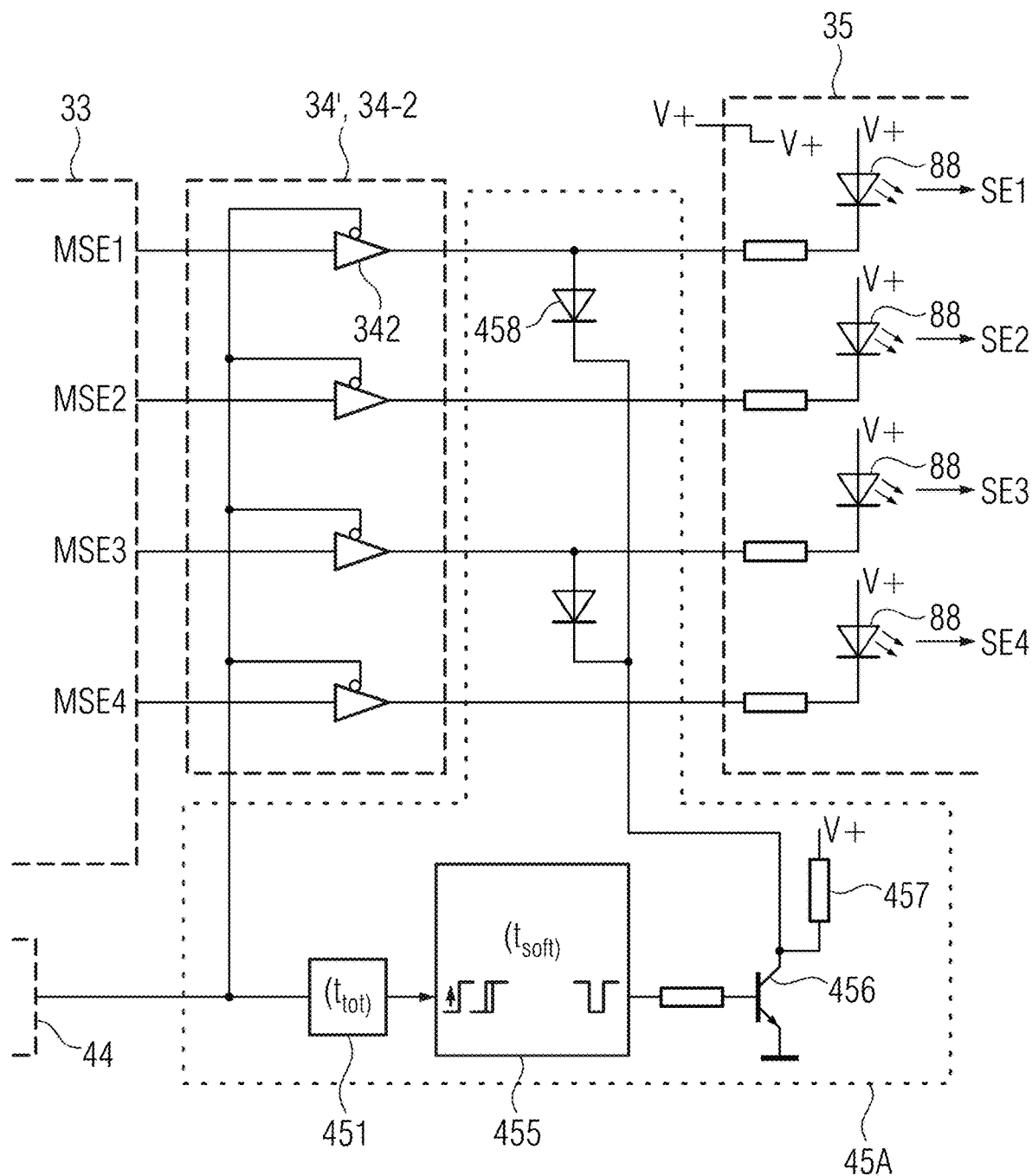
FIG. 8 shows a further possible circuit diagram of components of the MR device in FIG. 6 including the gradstop unit.

FIG. 8 shows a further possible variant of a combination of a gradstop unit 45A and the actuation driver stage 34' in a variant 34-2. Driver modules (e.g., modulator signal drivers 342) may be used for higher currents. These modulator signal drivers 342 are locked out by, for example, a "high" level at an "enable input" indicated by a respective circle and serve as feeder circuit breakers, therefore.

A "high" level of the monitoring unit 44 locks out the modulator signal drivers 342, whereupon the switching elements SE1 to SE4 of the end stage(s) are or remain switched off or switched to block since no current then flows through the light-emitting diodes 88. After a brief delay by $t_{tot}$ has expired in the delay element 451, the "high" level reaches a maintenance timer 455, which reacts, by way of example, to the "low"→"high" edge at its input with a "high" pulse with a duration that corresponds at least to the duration of the softstop current reduction $t_{soft}$ at its output. An npn transistor 456 is accordingly switched on for the duration $t_{soft}$; a collector connection of the npn transistor 456 may be regarded as a second output of the gradstop unit 45A, and an emitter connection of the npn transistor 456 lies at a reference potential. The collector connection of the transistor 456 is connected to cathode sides of diodes 458 that are connected at the anode side to outputs of corresponding modulator signal drivers 342 and cathode sides of the light-emitting diodes 88. The diodes 458 may also be regarded as components of the gradstop unit 45A.

If the transistor 456 is switched on, the diodes 458 are connected at the cathode-side to the reference potential, so a current may flow through the two light-emitting diodes 88 lying in the same signal path, through the diode 458, and through the transistor 456 to the reference potential. This leads to these two diodes being switched on and therewith of the switching elements SE1 and SE3 in the subsequent end stage 36, while the other two light-emitting diodes 88 remain switched off (e.g., this corresponds to the "upper softstop" shown in FIG. 2). If the transistor 456 is switched off, a resistor 457 pulls the line to the cathode connections of the diodes 458 to a positive voltage V+, which is also present at the anode side of the diodes 458, and the diodes 458 no longer have an effect on the signals of the actuation driver stage 34'.

If a "lower softstop" as illustrated in FIG. 3 is to be achieved, SE1 and SE3 on the one hand and SE2 and SE4 on the other hand in FIG. 7 and FIG. 8 may be actuated in an inverted manner, as is also generally possible.

The gradstop units 45 and 45A illustrated in FIG. 7 and FIG. 8 may react to fault states such as a detected failure of a clock signal or of an FPGA with a "softstop" (e.g., provided that the shut-off signal of the monitoring unit 44 is maintained at least for the period of the duration of the softstop current reduction $t_{soft}$).

The gradstop units 45 and 45A may also react to a failure of supply voltages with a "softstop," however, provided that the supply voltage V+ drawn in FIG. 7 and FIG. 8 and the supply to the monitoring unit 44 do not fail.

The adherence to the first condition that the duration of the shut-off signals output by the monitoring unit 44 is at least $t_{soft}$ may be improved by storage of the faults or the shut-off signals at the input of the gradstop units 45 and 45A (e.g., by a flip-flop). A corresponding storage element 466 (see FIG. 9) may require a reset signal in order to reset the fault. This storage element 466 makes it possible to also reliably react with a "softstop" to faults that occur sporadically or for a short time.

The input of the gradstop units 45 and 45A may generally be expanded to a plurality of inputs that all lead to the storage element 466, with the signals at these inputs accordingly no longer needing to have a minimum duration.

A failure of the supply voltage V+ may not only be that the logic modules of the gradstop units 45 or 45A no longer receive a supply voltage, but also that the transmit side of the electrical isolation apparatus 35 no longer receives a supply voltage V+and an actuation of the end stage 36 for a "softstop" is then not possible. To avoid a "hardstop" in the event of failure of the supply voltage V+, it is possible to provide a buffering of the supply voltage V+ by, for example, batteries or accumulators or a power supply (USV) fed uninterrupted from accumulators. If the supply voltage V+ is also used in other circuit parts, the supply voltage V+ of the gradstop unit 45, 45A used, together with the transmit side of the electrical isolation 35, may be separated from the remaining electronic devices so the power consumption of other circuit parts or even a short-circuit in these other circuit parts does not load the buffering.

Batteries or accumulators are to be regularly maintained or replaced owing to short service life. It is therefore advantageous if an energy store that is charged to a higher voltage than the supply voltage V+is available; the energy store may discharge in the case of load while supplying energy, and a voltage regulator connected to the energy store supplies a voltage at the level of the supply voltage V+. For example, a capacitor (e.g., an electrolyte capacitor) as an energy store is maintenance-free and significantly longer lasting than batteries or accumulators.

It is assumed, for example, that the end stage 36 is composed of five H-bridges or partial end stages connected in series, so for one end stage 36, at least 20 actuation signals are necessary for each of the five groups with in each case four switching elements SE1 to SE4. For improved easy servicing, the electrical isolation apparatus 35 may be fitted in the end stage 36, the circuitry with the at least 20 fiber optic conductors may then be fitted in the end stage during manufacture, and the connection of the actuation driver stage 34' to the electrical isolation apparatus 35 located in the end stage 36 is achieved, for example, by a multi-pole cable that may be connected via plugs. In the case of such a cable connection, pull-out protection monitoring that, inter alia when a cable is detached, may shut off the supply voltage V+ supplied by the actuation driver stage 34' may be available. The supply voltage V+ at the transmit side of the electrical separation 35 is necessary, however, for the actuation of the end stage 36 in order to set a "softstop" (e.g., that the gradstop unit 45, 45A has to switch on or provide the supply voltage V+ for the duration tsoft because the pull-out protection monitoring could of course have also erroneously detected a detached cable).

Figure 9:
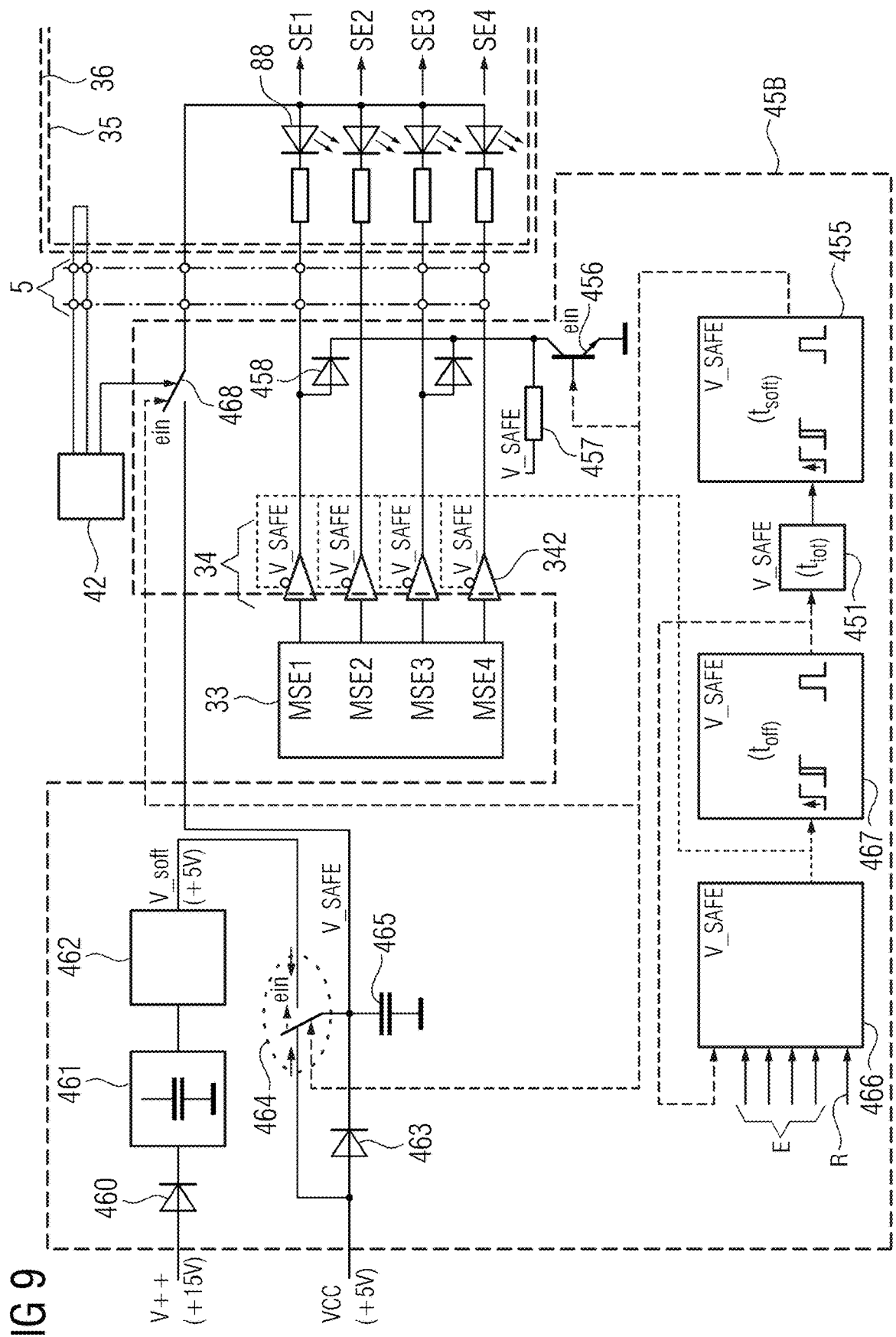
FIG. 9 shows yet a further possible embodiment of components of the MR device in FIG. 6 including the gradstop unit as a mixture of functional diagram and circuit diagram.

FIG. 9 shows a schematic diagram of an expanded gradstop unit 45B with a mixture of basic functional representation and circuit diagram. The gradstop unit 45B has the storage element 466 and pull-out protection monitoring and is secured against failure of supply voltages of the gradstop unit 45B and the transmit side of the electrical isolation 35. The actuation driver stage is configured analogously to the actuation driver stage 34-2.

New designations have been introduced for the supply voltage V+ compared to FIG. 7 and FIG. 8: the supply voltage of the gradstop unit 45B is accordingly referred to as V_SAFE, and the supply voltage of the remaining gradient pulse amplifier unit 2' is referred to as VCC. A supply voltage generated from an energy store 461 using a voltage regulator 462 is designated V_soft. Via a diode 460, a supply voltage V++ (e.g., of +15 V) charges the energy store 461, which may be, for example, an electrolyte capacitor. From the supply voltage V++ of the energy store 461, the voltage regulator 462 generates the supply voltage V_soft, which corresponds in terms of level to VCC. The supply voltage V_SAFE of the gradstop unit 45B is connected by a diode 463 to VCC.

In addition, a switch 464 is set such that V_SAFE is also connected by this switch 464 to VCC, so in a switch setting, the supply current of the gradstop unit 45B flows mainly through the switch 464, and the diode 463 is unloaded. V_SAFE is smoothed via, for example, a capacitor 465.

As an alternative circuit, the switch 464 has no connection to VCC, so during normal operation, V_SAFE is always smaller by the voltage drop of the diode 463 than VCC; this is, however, negligible with appropriate circuit design of the gradstop unit 45B and the electrical isolation 35. The switch connection V_SAFE to VCC increases the compatibility with existing end stages or electrical isolations, which were developed for the voltage VCC.

The capacitor 465 also prevents declining of V_SAFE if the switch 464 is switched over.

The signal input of the gradstop unit 45B is formed by the storage element 466 (e.g., an RS flip-flop) that may be set via a plurality of inputs E supplied by an OR function. For example, the inputs may be provided for receiving shut-off signals from the monitoring unit 44 owing to an FPGA defect or other shut-off requests.

A reset input R serves to reset the storage element 466. If the storage element 466 is set by a shut-off signal, then its output changes, for example, from "low" to "high". With a "high" level, for example, the modulator signal drivers 342 are locked out (the "enable input" of the modulator signal drivers 342 will hereinafter be assigned purely by way of example to the gradstop unit 45), and at the same time, a "high" pulse of duration (e.g., "minimum switch-off duration") $t_{off}$ will be triggered by the minimum switch-off timer 467 connected downstream. This "high" pulse is returned to an input of the storage element 466. For the minimum switch-off duration $t_{off}$ of the "high" pulse, the storage element 466 may accordingly no longer be reset by a reset. The minimum switch-off-timer 467 may be configured analogously to the maintenance timer 455.

Delayed by the safety time $t_{tot}$ of the delay element 451, the "high" pulse arrives at the maintenance timer 455, which generates a "high" pulse at least of the duration of the softstop current reduction $t_{soft}$. If a value, for example, of approximately 500 ns is assumed for the safety time $t_{tot}$, the runtime from the input of the shut-off signal to the "high" pulse of the maintenance timer 455 is set, for example, at approximately 1 µs.

With the "high" pulse of the maintenance timer 45, switch 464 is switched over, and V_SAFE is accordingly fed by V_soft via the voltage regulator 462 from the energy store 461. At the same time, the transistor 456 is switched on with this "high" pulse, so the end stage 36 is actuated via the diodes 458 with a softstop actuation pattern.

In the illustrated exemplary embodiment, it is also assumed by way of example that a multi-pole line 5 (e.g., cable) is available between the actuation driver stage 34' and the electrical isolation apparatus 35 fitted, for example, in the end stage 36. Pull-out protection monitoring may thus be implemented, which may be achieved, for example, in the monitoring unit 42 and which may shut off the power supply of the electrical isolation apparatus 35 via switch 468. The switch 468, should it be open, is closed by the "high" pulse of the maintenance timer 455.

After the duration of the softstop current reduction $t_{soft}$ has expired, the transistor 456 is switched off; from this instant, the end stage(s) 36 no longer receive(s) an actuation to switch on, so then all end stage switching elements SE1 to SE4 are switched off. Subsequently, the switch 468 may be opened again, and switch 464 switches back to the power supply by way of VCC.

The store 466 remains set until the minimum switch-off duration $t_{off}$ has elapsed; only thereafter may the store 466 react to a reset signal. Up to this reset, all end stage switching elements SE1 to SE4 remain switched off due to the gradstop unit 45B.

The behavior of the gradstop unit 45B as a function of the supply voltages V++ and VCC may be described more accurately as follows:

V++ and VCC are Available

Triggering of the gradstop unit 45B with an available supply voltage V++ (e.g., of +15 V) loads the voltage regulator 462 the most: For the duration of the softstop current reduction $t_{soft}$, it has to apply the supply current of the end stage actuations and the gradstop unit 45B, with the voltage of the energy store 461 being maintained at V++.

The power dissipation may be estimated from V++ (15 V)−VCC (5 V)=10 V (e.g., voltage at the voltage regulator 462). If the delivered supply current is, for example, 1.25 A, this results in a power dissipation P of 10 V·1.25 A=12.5 W. With a power dissipation of 12.5 W, a heat sink may be advantageous for the voltage regulator 462, although this power dissipation P actually occurs only for the brief duration of the softstop current reduction $t_{soft}$ and due to the heat capacity of the voltage regulator 462 leads to only moderate heating. The voltage regulator 462 also has adequate time to cool down due to the introduction of the minimum switch-off timer 467, and with appropriate choice of the minimum switch-off duration $t_{off}$, it may practically no longer be possible to overheat the voltage regulator even with repeated shortest possible reset and re-triggering of the gradstop unit 45B. There is thus no need for a heat sink for the voltage regulator 462 (e.g., there is no need to use a switched-mode power supply for the functioning of the voltage regulator 462).

The gradstop unit 45B operates as described for FIG. 8, and the energy store 461 is not required.

V++ is Available, VCC has Failed

The failure of the supply voltage VCC is detected by the voltage monitoring facility 43 (e.g., providing redundancy). If the first tolerance threshold is fallen below by, for example, 0.7 V, a "softstop" of the modulator 33 is triggered by the voltage monitoring facility 43 via the monitoring unit 42. Shortly after, if the second tolerance threshold is fallen below, the gradstop unit 45B is triggered by the voltage monitoring facility 43 via the monitoring unit 44. The following signals thus occur at the output of the actuation driver stage 34':

Normal modulation if the supply voltage V++ is within the tolerance window; softstop, if the supply voltage V++ is below the first tolerance threshold; if the supply voltage V++ is below the second tolerance threshold, hardstop for approx. 1 μs, then "softstop" for the duration of the softstop current reduction $t_{soft}$, then hardstop.

For a fast reaction to detection of a decline in the supply voltage VCC, the voltage monitoring facility 43 has to function with a short delay accordingly. The trigger time for triggering the "safestop" via the gradstop unit 45B does not play a critical role at approximately 1 μs. Until the switch 464 is switched over, the gradstop unit 45B is fed from the buffer capacitor 465. If the supply voltage VCC has failed, the diode 463 is in the reverse direction.

The switch 464 may be formed by transistors. While the switch 468 may be, for example, a MOSFET (e.g., a p-channel MOSFET), a MOSFET may not be suitable as switch 464 since with source at VCC and drain at V_SAFE, a discharging of V_SAFE via the MOSFET-internal diode may take place. The arrows at the symbol for the switch 464 in FIG. 9 are intended to indicate the permitted current direction. As soon as the switch 464 has switched over, V_SAFE is supplied by the voltage regulator 462, and the buffer capacitor 465 is charged again by the voltage regulator 462. The gradstop unit 45B carries out the actuation of the end stage 36 with a softstop actuation pattern until the duration of the softstop current reduction $t_{soft}$ has expired. After the duration of the softstop current reduction $t_{soft}$ has expired, the switch 464 switches over again, and the supply of V_SAFE from the voltage regulator 462 is thus omitted. V_SAFE is accordingly largely relieved since the outputs of the actuation driver stage 34' are blocked from this instant. VCC is no longer available, and the diode 463 is switched in the reverse direction. However, the changed actuation of the switch 464 may lead to gradual discharging of V_SAFE to VCC or zero volts. The voltage at the capacitor 465 will approach zero, the "high" level (e.g., relative to V_SAFE) at the output of the store 466 is maintained up to low voltages, and the driver stage 34' supplied by V_SAFE is and remains locked out.

V++ has Failed, VCC is Available

Before failure of the supply voltage V++, it must have been available, otherwise the gradient pulse amplifier unit 2' would be permanently blocked, no current could have built up in the coil or inductor 40, and the need to consider this scenario would not have arisen.

Since the supply voltage V++ was available, the energy store 461 is fully charged. The failure of the supply voltage V++ is detected by the voltage monitoring facility 43 (e.g., providing redundancy). If the first tolerance threshold is fallen below, the modulator 33 is actuated by the voltage monitoring facility 43 via the monitoring unit 42 to trigger a "softstop". A short time later, if the second tolerance threshold is fallen below, the gradstop unit 45B is triggered by the voltage monitoring 43 via the monitoring unit 44.

The following signals thus occur at the output of the actuation driver stage 34':

Normal modulation—if the supply voltage V++ is within the tolerance—softstop, if the supply voltage V++ is below the first tolerance threshold; if V++ is below the second tolerance threshold, hardstop for approximately 1 μs, then "softstop" for the duration of the softstop current reduction $t_{soft}$, then hardstop.

After triggering of the gradstop unit 45B, the supply of V_SAFE is switched over to V_soft.

Since the supply voltage V++ has failed, the energy store 461 is discharged for the duration of the softstop current reduction $t_{soft}$ to supply the gradstop unit 45B. Should the duration of the softstop current reduction $t_{soft}$ be chosen to be too long or the energy store 461 too small, the gradstop unit 45B is supplied from the supply voltage VCC after reaching the supply voltage VCC, minus a forward voltage of the diode 463. After the duration of the softstop current reduction $t_{soft}$ has expired, the switch 464 switches over and connects V_SAFE to VCC. Since the switch 464 is built such that a feed-back of V_SAFE to V_soft does not take place, the supply voltage V_soft will approach zero without recharging of the energy store 461 from V++. Since V++ is absent, the corresponding error message is constantly present at the gradstop unit 45B, and a reset of the gradstop unit 45B is not possible. The gradient pulse amplifier unit 2' persists in the "off" state.

A minimum capacity $C_{min}$ of the energy store 461 when a linear voltage regulator 462 is used may be estimated, for example, as follows: as in the example for calculation of the power dissipation P, the necessary current would be 1.25 A. The supply voltage V++ would have a nominal value of 15 V. At the second, lower tolerance limit of the voltage monitoring apparatus 43 to V++ (e.g., at which the gradstop unit 45B is triggered) and taking into account the (Schottky) diode 460, the voltage of the energy store 461 would then be, for example, 14 V. A low-drop voltage regulator 462 requires, for example, a voltage drop of 0.5 V. This results in the following values: initial voltage 14 V; end voltage=V_SAFE+0.5 V=5.5 V, difference 14 V−5.5 V=8.5 V, $t_{soft}$=30 ms, from which for Cmin=1.25 A*30 ms/8.5 V=4.4 mF follows.

V++ and VCC Have Failed

Before failure of the supply voltage V++, it must have been available; otherwise, the gradient pulse amplifier unit 2' would be permanently locked out, would have not been able to build up current in the inductor 40, and the need to consider this point would not have arisen.

Since the supply voltage V++ was previously available, the energy store 461 is fully charged. The failure of the supply voltage V++ and/or the supply voltage VCC is detected by the voltage monitoring facility 43 (e.g., providing redundancy). If the first tolerance threshold is fallen below, a "softstop" of the modulator 33 is triggered by the voltage monitoring facility 43 via the monitoring unit 42.

Shortly after, if the second tolerance threshold is fallen below, the gradstop unit 45B is triggered by the voltage monitoring 43 via the monitoring unit 44.

The following signals thus occur at the output of the actuation driver stage 34':

Normal modulation, if V++ is within the tolerance window; softstop, if one of the two supply voltages is below the first tolerance threshold; if one of the two supply voltages falls below the second tolerance threshold, hardstop for approximately 1 µs, then "softstop" for the duration of the softstop current reduction $t_{soft}$, then hardstop.

After triggering of the gradstop unit 45B, the switch 464 is switched over after approximately 1 µs from VCC to V_soft. A return flow from V_SAFE to VCC is prevented by the design of the switch 464, and the capacitor 465 thus buffers V_SAFE. Since V++ has failed, the energy store 461 is discharged for the duration of the softstop current reduction $t_{soft}$ to supply the gradstop unit 45B, and during this time, the end stage 36 is actuated with a softstop actuation pattern. After the duration of the softstop current reduction $t_{soft}$ has expired, the switch 464 switches over again, and the supply of V_SAFE from the voltage regulator 462 is thus omitted. V_SAFE is accordingly largely relieved since the outputs of the actuation driver stage 34' are locked out from this instant. VCC is no longer available, the diode 463 is in the reverse direction, but the changed actuation of the switch 464 may lead to gradual discharging of V_SAFE to VCC or zero volts. The voltage at the capacitor 465 approaches zero, the "high" level (relative to V_SAFE) at the output of the store is maintained, and the actuation driver stage 34' supplied by V_SAFE is and thus remains locked out.

A functional sequence of the gradstop unit 45B may thus be configured, for example, as follows:
(1) A shut-off signal occurs at one of the inputs E of the gradstop unit 45B;
subsequently:
(2.1) the storage element 466 stores the shut-off signal and sets the gradstop unit 45B to lock out the feeder circuit breakers;
(2.2) the minimum switch-off timer 467 generates a minimum switch-off duration $t_{off}$ while that of the memory chip 466 is maintained as set in that a reset is blocked;
subsequently:
(3) a delay to the safety time trot is generated by the delay element 451 so no short-circuit actuation of the end stage 36 occurs when the actuation is changed;
subsequently:
(4.1) the gradstop unit 45B is supplied from the energy store 461;
(4.2) if the power supply of the electrical isolation apparatus 35 may switched be off, it is provided that the power supply of the electrical isolation apparatus 35 is switched on;
(4.3) an actuation pattern in accordance with a "softstop" is generated in the actuation driver stage 34' by the gradstop unit 45B;
subsequently:
(5.1) the power supply unit from the energy store 461 is maintained for the duration of the softstop current reduction $t_{soft}$;
(5.2) the softstop actuation pattern is maintained for the time $t_{soft}$;
subsequently:
(6.1) all outputs of the actuation driver stage 34' are locked out after the duration of the softstop current reduction $t_{soft}$ has expired;

(6.2) the gradstop unit 45B is again supplied from the supply voltage provided for the gradstop unit 45B;
subsequently:
(7) a resetting of the memory chip 466 is permitted after the minimum switch-off duration $t_{off}$ has expired if a shut-off signal is no longer present at the inputs of the gradstop unit 45B.

Figure 10:
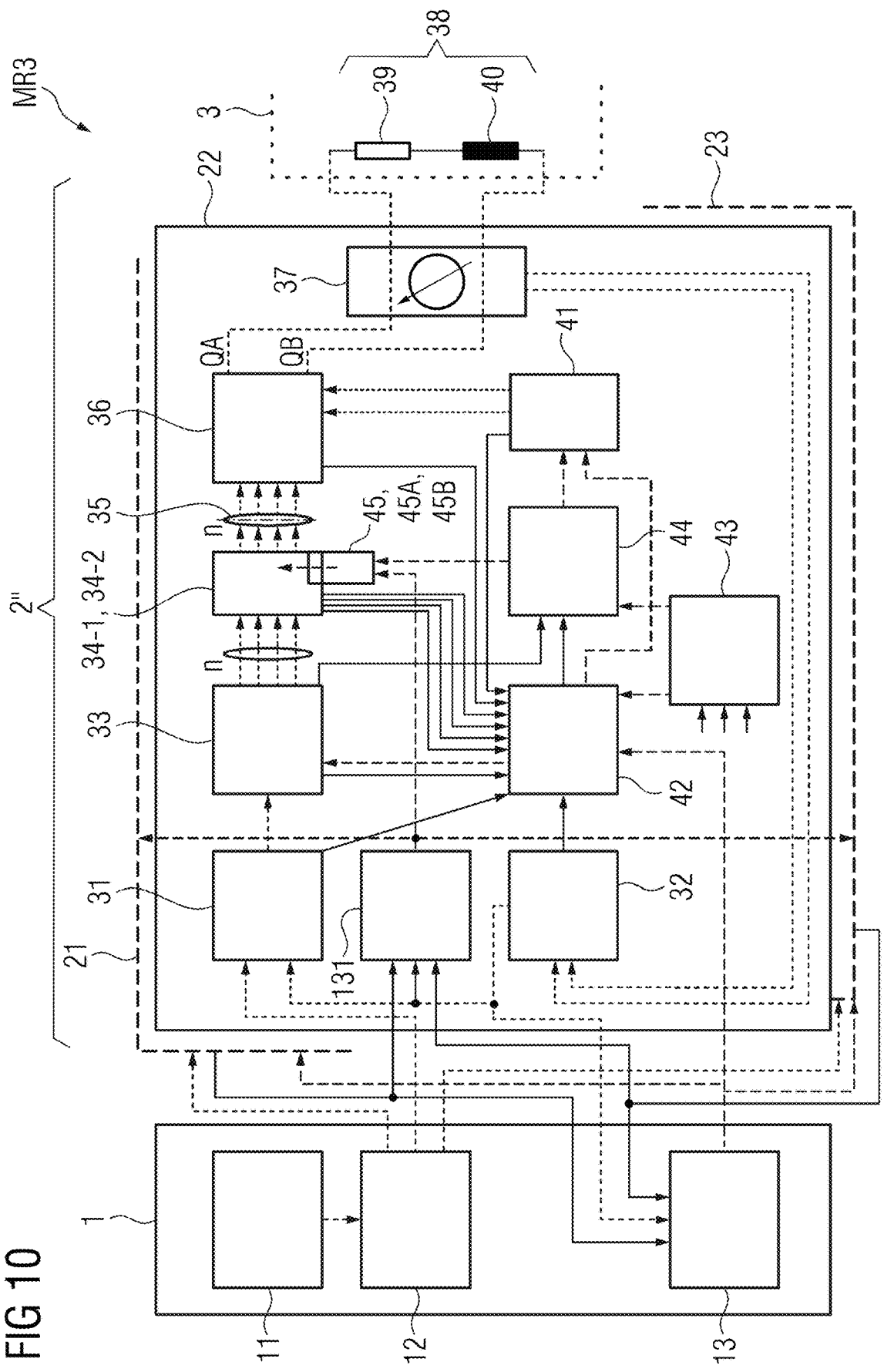
FIG. 10 shows as a functional diagram components of a further MR device for generation of a gradient field, which is expanded by a further monitoring unit compared to the MR device in FIG. 6.

FIG. 10 shows as a functional diagram components of an MR system MR3 for generation of a gradient field with a modified gradient pulse amplifier unit 2', which is expanded by a monitoring facility 131 compared to the MR system MR2. The monitoring facility 131 serves to provide an additional or alternative protection path for avoiding a hardstop. The supply voltage V_soft is very important for a "safestop". It will therefore be incorporated in voltage monitoring.

The comprehensive voltage monitoring may provide, for example, that the supply voltages of the two "protection paths" and the control circuits of the gradient amplifier apparatuses 21, 22, 23 (e.g., "control path") do not have to be separated according to function or action path.

Specifically, the modulator 33 forms part of the "protection path" and the "control path", and likewise, the actual value amplifier 32, there is no separation of corresponding supply voltages according to action path. The previously customary conception is that when a protection path fails (e.g., due to failure of a supply voltage), a further protection path is still available and the failure will be noticed (e.g., during a routine test). Since MR systems MR2 and MR3 may be continuously operated for several days, it may be a very long time until the failure is noticed by way of tests. By contrast, the repeatedly available voltage monitoring facility 43 is, for example, constantly alert and its reaction is an activation of a "softstop" exactly as if it were also the reaction of the "protection path".

The monitoring unit 13 is not monitored by the voltage monitoring facility 43 in the gradient pulse amplifier unit 2''. With an interruption to a supply voltage and therewith dubious functioning of the monitoring facility 13, the monitoring 13 may no longer send an "OK" signal to the gradient pulse amplifier unit 2. Otherwise, the failure of the monitoring facility 13, if it is not sporadic, would only be found during a routine test.

In the MR system MR3, as in the case of the monitoring facility 13, it is irrelevant to the basic functioning of the monitoring unit 131 whether it is located in a gradient pulse amplifier unit 2'' (as shown) or at a different location. The monitoring facilities 13 and 131 are not assigned to a particular gradient axis since for calculation of the total stimulation, the monitoring facilities 13 and 131 require the actual values of X, Y and Z, and a corresponding monitoring signal for shutting off all gradient pulse amplifier units 21, 22, 23 may pass via "softstop".

As with the monitoring facility 13, the current actual values of the actual value amplifiers 32 represent the input signals thereof in the case of the monitoring unit 131 as well. The output signals of the monitoring unit 131 are supplied to an input E of the gradstop unit 45, 45A or 45B.

Since the gradstop unit 45B has a plurality of inputs, the shut-off signal of one of the monitoring facilities 13 and/or 131 (e.g., in the example of FIG. 9, of the monitoring facility 131) may be supplied directly to the gradstop unit 45, 45A, or 45B, bypassing the modulator 33 and the monitoring facilities or apparatuses 42, 43, and 44, and consequently, a "softstop" may be triggered. Two separate shut-off methods which bring about a "softstop" thus now exist.

As already described for FIG. 1, two current sensors are used for measuring, and the current actual value formed from the first current sensor or the first and second current sensors are constantly checked for plausibility and tolerance in relation to the second current sensor signal. It is thus possible to recognize whether the current sensor signals are synchronized and whether the current actual value lies in the specified amplification tolerance in relation to a current sensor signal. If one or both of the tolerance thresholds are overshot, shutoff occurs via "softstop". Similarly, it is possible to monitor, for example, whether a cable to the current sensors is actually connected, etc.

In addition to the above structural embodiments, it is advantageous if the MR systems MR, MR2, and MR3 are subjected to routine tests.

Constantly Active Monitoring Processes

Constantly active monitoring processes may include, inter alia, an actual value plausibility and monitoring of the output signals of the actuation driver stage 34', which for this purpose, are supplied to the monitoring unit 42. The monitoring unit 42 may check, for example, whether actuation signals may result in a bridge short-circuit. The constantly active monitoring processes may, however, also check whether the modulator 33, when actuated for a "softstop", carries this out. Should an actuation signal not match a softstop actuation pattern, the gradstop unit 45 is tasked with shutting off, and an error message about a defective modulator 33 is output.

Routine Gradient Pulse Amplifier Unit-Internal Tests

Such tests result in the gradient pulse amplifier unit being shut off and therefore cannot be carried out during normal operation of the MR systems MR, MR2, and MR3. A favorable time for this test is, for example, when the gradient pulse amplifier unit is connected to the voltage. Controlled by a higher-order unit or by, for example, the monitoring unit 42, test signals may be generated in order to test whether the monitoring of the actual value plausibility and the pull-out protection of the current sensor connection is functioning. In a further test step, the modulator 33 is set to adjust a softstop actuation pattern, and it is then determined from the output signals of the actuation driver stage 34' whether a "softstop" is actually carried out. In a further test step, the modulator 33 is locked out and the gradstop unit 45 triggered. In the process, it is checked whether the gradstop unit 45 carries out a "softstop", the duration of $t_{soft}$ lies within the tolerance, and after tsoft, the end stage(s) 36 are locked out.

Routine System Tests

If there is no patient located in the MR systems MR, MR2, and MR3, an actual current value, which results in the monitoring units 13 and 131 being shut off, may then be actuated with a corresponding desired value. One of the monitoring units may be a constituent part of the system controller since then the limit values may be specified "directly" such that the monitoring unit 13 or 131 is selectively triggered. The e-function of the current reduction may also be checked in the process. The time intervals of the tests conform to the probability of failure of the monitoring functions for testing.

Although the invention has been illustrated and described in detail by the exemplary embodiments shown, the invention is not limited thereto, and a person skilled in the art may derive other variations herefrom without departing from the scope of the invention.

For example, instead of IBGT, other semiconductor circuit breakers may be used. Further, instead of FPGAs, ASICs or microcontrollers, etc. may be used.

Generally, "a", "an", etc. may be taken to be a singular or a plurality (e.g., within the meaning of "at least one" or "one or more", etc.), as long as this is not explicitly ruled out, for example, by the expression "exactly one", etc.

Numerical data may also include exactly the indicated number as well as a customary tolerance range, as long as this is not explicitly ruled out.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance (MR) system with a gradient pulse amplifier unit, the gradient pulse amplifier unit comprising at least one end stage connected to a gradient coil with in each case a plurality of switching elements, a modulator operable to actuate the plurality of switching elements of the at least one end stage, lockout switches interconnected in signal paths from the modulator to the plurality of switching elements, the lockout switches, when operated, being operable to lock out the associated signal paths for actuation signals output by the modulator, feeder circuit breakers interconnected in at least some signal paths from the modulator to the plurality of switching elements, the feeder circuit breakers being connected in the associated signal paths downstream of the lockout switches, the feeder circuit breakers, when operated on the associated signal paths, operable to apply an actuation signal to the plurality of switching elements of the respective end stage connected to the associated signal paths, and a gradstop unit that is configured to receive at least one shut-off signal and actuate the lockout switches and the feeder circuit breakers, the method comprising:
receiving, by the gradstop unit, a shut-off signal; and
when the shut-off signal is received:
actuating, by the gradstop unit, the lockout switches to lock out; and
actuating, by the gradstop unit, the feeder circuit breakers to output an actuation signal to the plurality of switching elements.

2. The method of claim 1, wherein actuating, by the gradstop unit, the feeder circuit breakers comprises actuating, by the gradstop unit, the feeder circuit breakers delayed by a safety time with respect to the lockout switches.

3. The method of claim 1, wherein actuating, by the gradstop unit, the feeder circuit breakers comprises actuating, by the gradstop unit, the feeder circuit breakers at least for a specified duration of a softstop-current reduction.

4. The method of claim 3, further comprising preventing a resetting of the gradstop unit for the specified duration of the softstop current reduction.

5. A magnetic resonance (MR) system comprising:
a system controller; and
a gradient pulse amplifier unit, wherein the gradient pulse amplifier unit comprises:
- at least one end stage connected to a gradient coil with in each case a plurality of switching elements;
- a modulator operable to actuate the plurality of switching elements of the at least one end stage;
- lockout switches interconnected in signal paths from the modulator to the plurality of switching elements, the lockout switches, when operated, being operable to lock out the associated signal paths;
- feeder circuit breakers interconnected in at least some signal paths from the modulator to the plurality of switching elements, the feeder circuit breakers being connected in the associated signal paths downstream of the lockout switches and, when operated on the associated signal paths, being operable to apply an actuation signal to switching elements of the plurality of switching elements connected to the associated signal paths; and
- a gradstop unit having at least one input configured to receive at least one shut-off signal, a first output for operating the lockout switches, and a second output for operating the feeder circuit breakers, wherein the gradstop unit is configured to:
receive a shut-off signal; and
when the shut-off signal is received:
  actuate the lockout switches to lock out; and
  actuate the feeder circuit breakers to output the actuation signal to the switching elements.

6. The MR system of claim 5, wherein each end stage of the at least one end stage has four switching elements connected together as an H-bridge, the four switching elements being switchable by respective power drivers,
wherein the power drivers are connected by respective signal paths to associated modulator outputs of the modulator,
wherein a respective lockout switch of the lockout switches is interconnected in each of the four signal paths, and
wherein respective feeder circuit breakers are interconnected in two of the four signal paths, which run to switching elements that are connected to a shared pole of a power supply unit.

7. The MR system of claim 6, wherein four of the lockout switches are in the form of OR gates that are connected by an input to an associated modulator output and by a different input to the first output of the gradstop unit, and
wherein two of the feeder circuit breakers are in the form of AND gates that are in each case connected by an input to an output of a lockout switch of the lockout switches connected upstream and by a different input to the second output of the gradstop unit, and by an output to an associated switching element of the plurality of switching elements of the end stage.

8. The MR system of claim 6, wherein four of the lockout switches, interconnected in respective signal paths, are in the form of self-conducting modulator signal drivers with respective enable inputs that are connected to the first output of the gradstop unit, and
wherein two of the feeder circuit breakers are in the form of diodes that are connected at an anode side to an output of an associated modulator signal driver, and at a cathode side to the second output of the gradstop unit.

9. The MR system of claim 6, wherein the gradstop unit comprises a timer configured to output an actuation signal for the feeder circuit breakers for a duration of a softstop current reduction in response to an input of a shut-off signal to the second output, and the first output is connected upstream of this timer.

10. The MR system of claim 6, wherein the gradstop unit comprises a timer configured to delay the shut-off signal by a safety time, the first output is connected upstream of the timer, and the second output is connected downstream of the timer.

11. The MR system of claim 6, wherein the gradstop unit has a memory chip that has at least one input for receiving at least one shut-off signal and a reset input, and
wherein the memory chip is configured to store a shut-off signal of the at least one shut-off signal and forward the shut-off signal until a reset signal is received at the reset input.

12. The MR system of claim 11, wherein the gradstop unit comprises a timer connected at the input side to an output of the memory chip, wherein the timer is configured to forward the shut-off signal output by the memory chip and to block a reaction of the memory chip to a reset signal for a minimum switch-off duration.

13. The MR system of claim 6, wherein at least the gradstop unit is suppliable with electrical energy by a voltage supply facility that has an energy store, downstream of which a voltage regulator is connected.

14. The MR system of claim 6, further comprising an electrical isolation facility in the signal paths between the lockout switches or the feeder circuit breakers and the plurality of switching elements of the end stage.

* * * * *